United States Patent
Segi et al.

(10) Patent No.: US 6,335,281 B1
(45) Date of Patent: Jan. 1, 2002

(54) DEPOSITED FILM FORMING PROCESS

(75) Inventors: Yoshio Segi; Hideaki Matsuoka; Hiroyuki Katagiri; Yasuyoshi Takai, all of Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/334,176

(22) Filed: Jun. 16, 1999

(30) Foreign Application Priority Data

Jun. 18, 1998 (JP) ............................................ 10-188192
Jun. 14, 1999 (JP) ............................................ 11-166600

(51) Int. Cl.$^7$ ............................................. H01L 21/44
(52) U.S. Cl. ...................... 438/680; 438/681; 438/758; 438/799
(58) Field of Search ........................... 438/5, 496, 584, 438/680, 681, 758, 799

(56) References Cited

U.S. PATENT DOCUMENTS

| | | | | |
|---|---|---|---|---|
| 4,643,527 A | * | 2/1987 | Magarino et al. | 350/333 |
| 4,717,586 A | * | 1/1988 | Ishihara et al. | 427/39 |
| 4,840,139 A | * | 6/1989 | Takei | 118/727 |
| 4,957,772 A | * | 9/1990 | Saitoh | 427/39 |
| 5,016,565 A | * | 5/1991 | Saitoh et al. | 118/727 |
| 5,223,453 A | * | 6/1993 | Sopori | 437/173 |
| 5,360,484 A | * | 11/1994 | Takai et al. | 118/723 |
| 5,597,623 A | * | 1/1997 | Takai et al. | 427/575 |
| 5,738,963 A | * | 4/1998 | Niino | 430/57 |
| 5,859,408 A | * | 1/1999 | Baxenine | 219/390 |

FOREIGN PATENT DOCUMENTS

| | | |
|---|---|---|
| JP | 54-086341 | 7/1979 |
| JP | 60-086276 | 5/1985 |
| JP | 60-168156 | 8/1985 |
| JP | 60-178457 | 9/1985 |
| JP | 60-225854 | 11/1985 |
| JP | 61-231561 | 10/1986 |
| JP | 07-181700 | 7/1995 |
| JP | 07-230178 | 8/1995 |

OTHER PUBLICATIONS

Stanley Wofl and Richard N. Tauber, Silicon Processing for the VLSI Era vol. 1: Process Technology, 1986, Lattice Press, pp. 164–171.*
C. Y. Chang and S. M. Sze, VLSI Technology, 1996, McGraw–Hill Companies, Inc., pp. 164, 206–207, 212.*

* cited by examiner

*Primary Examiner*—Matthew Smith
*Assistant Examiner*—V. Yevsikov
(74) *Attorney, Agent, or Firm*—Fitzpatrick, Cella, Harper & Scinto

(57) ABSTRACT

In a deposited film forming process or apparatus, a deposited film is formed on a film-forming substrate by reduced-pressure vapor phase growth. The film-forming substrate is set on an auxiliary substrate and an auxiliary-substrate cap member is set at the upper part thereof. A maximum temperature difference between temperature at the upper end of the film-forming substrate and the temperature at the lower end of the auxiliary-substrate cap member provided on the film-forming substrate at its upper part is so controlled as to be not greater than a prescribed value so that a film deposited on the auxiliary-substrate cap member is improved in adhesion. Any deposits of films on the part other than the film-forming substrate can be prevented from coming off and scattering on the film-forming substrate so that deposited films having uniform film thickness and film quality can steadily be formed and also faulty images can occur less frequently. It is also possible to achieve improvements of various properties of films formed, film forming rate, reproducibility, and productivity so that yield can dramatically be improved in mass production.

34 Claims, 7 Drawing Sheets

SUBSTRATE PRESET TEMP.

SUBSTRATE TEMP.

DEPOSITED FILM FORMING PROCESS

BACKGROUND OF THE INVENTION

1. Field of the Invention

This invention relates to a deposited film forming process and a deposited film forming apparatus. More particularly, it relates to a deposited film forming process and a deposited film forming apparatus which are suited for stably forming light-receiving members having a sensitivity to electromagnetic waves such as light (which herein refers to light in a broad sense and indicates ultraviolet rays, visible rays, infrared rays, X-rays, γ-rays, etc.).

2. Related Background Art

Materials that form photoconductive layers in solid-state image pick-up devices or in electrophotographic light-receiving members in the field of image formation or in character readers are required to have properties as follows: They are highly sensitive, have a high SN ratio (photocurrent (Ip)/(Id)), have absorption spectra suited to spectral characteristics of electromagnetic waves to be radiated, have a high response to light, have the desired dark resistance and are harmless to human bodies when used; and also, in the solid-state image pick-up devices, the materials are required to have properties that enable easy erasure of the lag in a prescribed time. In particular, in the case of light-receiving members of electrophotographic apparatus used as business machines in offices, the harmlessness in their use is important.

Materials that attract notice from such viewpoints include amorphous silicon (hereinafter "a-Si" whose dangling bonds have been modified with monovalent elements such as hydrogen or halogen atoms, and its application to electrophotographic light-receiving members is disclosed in, e.g., Japanese Patent Application Laid-Open No. 54-86341.

Electrophotographic light-receiving members are known to have various forms. Those having the form of what is called a drum are commonly used. In this case, the desired layers such as photoconductive layers, i.e., light-receiving layers are formed on the surfaces of cylindrical substrates to form light-receiving members.

When light-receiving layers comprised of a-Si are formed on cylindrical substrates, many processes are known in the art, as exemplified by sputtering, a process in which material gases are decomposed by heat (thermal CVD), a process in which material gases are decomposed by light (photo-assisted CVD) and a process in which material gases are decomposed by plasma (plasma-assisted CVD). In particular, one having been put into practical use in a very advanced state is plasma CVD (chemical vapor deposition), i.e., a process in which material gases are decomposed by direct-current or high-frequency or microwave glow discharging to form deposited films on the cylindrical substrate.

FIG. 1 is a cross-sectional schematic view showing an example of a plasma CVD system. In FIG. 1, reference numeral 6100 denotes the whole of a vacuum reactor; 6111 a cathode electrode serving also as the sidewall of the vacuum reactor; 6123 a gate that forms the top wall of the vacuum reactor; and 6121 the bottom wall of the vacuum reactor. The cathode electrode 6111 the top wall 6123 and the bottom wall 6121 are each insulated with an insulator 6122 Reference numeral 6112 denotes a cylindrical, film-forming substrate (herein meant to be a target substrate on which the deposited film is to be formed) set on an auxiliary substrate 6113-a made of a metal such as aluminum, and disposed in the vacuum reactor. The film-forming substrate 6112 is fitted with an auxiliary-substrate cap 6113-b at the top end thereof. The film-forming substrate 6112 is grounded to serve as the anode electrode. In the auxiliary substrate 6113-a, a substrate heater 6114 is disposed so as to be used to maintain the film-forming substrate at a prescribed temperature during film formation or to anneal the film-forming substrate after film formation.

Reference numeral 6115 denotes a deposited film forming material gas feed pipe, and is provided with a large number of gas release holes (not shown) through which material gases are released into the vacuum reaction space. At the other end of the material gas feed pipe 6115, the pipe communicates with a deposited film forming material gas feed system 6200 via a gas feed pipe 6117 and a valve 6260.

Reference numeral 6124 is an exhaust pipe through which the inside of the vacuum reactor is evacuated, and communicates with a vacuum exhaust system (not shown) via an exhaust valve 6119. A vacuum gauge 6120 is connected to the exhaust pipe 6124, and a reactor leak valve 6118 used when, e.g., the inside of the vacuum reactor is set open to the atmosphere is also connected to the exhaust pipe 6124. Reference numeral 6111 denotes a means for applying electric power to the cathode electrode 6111.

The deposited film forming material gas feed system 6200 has material gas cylinders 6221 to 6226 holding the desired material gases. The gas cylinders 6221 to 6226 are connected to their piping via valves 6231 to 6236 so that material gases can be flowed into mass flow controllers 6211 to 6216 via flow-in valves 6241 to 6146, respectively. From the mass flow controllers 6211 to 6216, the piping is so connected as to come to meet in the valve 6240 via flow-out valves 6251 to 6256. Pressure controllers 6261 to 6266 are connected between the material gas cylinders 6221 to 6226 and the flow-in valves 6241 to 6146, respectively, in the piping.

Such a deposited film forming apparatus employing plasma CVD is operated in the following way.

The inside of the vacuum reactor is evacuated through the exhaust pipe 6124, and also the film-forming substrate 6112 is heated to and kept at a prescribed temperature by means of the heater 6114. Next, through the material gas feed pipe 6115, when, e.g., a-Si deposited films are formed, material gases such as silane are introduced into the vacuum reactor. The material gases are released from the material gas release holes (not shown) of the gas feed pipe into the vacuum reactor. Concurrently therewith, from a voltage applying means 6116, for example a high frequency power is applied across the cathode electrode 6111 and the film-forming substrate (anode electrode) 6112 to cause plasma discharge to take place. Thus, the material gas inside the vacuum reactor is excited into excited species, where radical particles, electrons and ionic particles of Si* and SiH* (the mark * indicates an excited state) are produced and a deposited film is formed on the film-forming substrate surface by chemical mutual action between these particles themselves or between these particles and the film-forming substrate surface.

In such an instance where an electrophotographic light-receiving member comprised of, e.g., a-Si, an auxiliary substrate is inserted into the film-forming cylindrical substrate because the film-forming cylindrical substrate must be transported into the vacuum reactor and held there. Such an auxiliary substrate is also commonly inserted into the film-forming cylindrical substrate because, as disclosed in, e.g., Japanese Patent Application Laid-Open No. 60-86276, auxiliary substrates must be provided at the upper and lower part of a film-forming substrate so that its characteristics can be made uniform. Still also, e.g., Japanese Patent Application Laid-Open No. 7-181700 discloses a technique in which, for the purpose of preventing faulty images, achieving an improvement in electrophotographic performance and obtaining much uniform and high-quality images, the auxiliary substrate is basically so constituted that a material having a great thermal conductivity is used at its part facing the film-forming substrate and a material having a small coefficient of thermal expansion and a small thermal conductivity is used at the upper part and/or lower part of the auxiliary substrate.

As another example, Japanese Patent Application Laid-Open No. 7-230178 discloses a technique in which, for the purpose of preventing faulty images, achieving an improvement in electrophotographic performance and obtaining much uniform and high-quality images, the surface of an auxiliary substrate is formed of a ceramic material.

These techniques have brought about an improvement in uniformity of film thickness and film quality of electrophotographic light-receiving members and have concurrently brought about an improvement in yield, too.

Light-receiving members produced using such an apparatus have been made to have uniform film thickness and film quality and improved in yield. Under existing circumstances, however, there is room for further improvement in order to achieve an improvement of overall performances. In particular, electrophotographic apparatus are rapidly being made higher in image quality, higher in process speed and higher in durability. Accordingly, when such light-receiving members are used as electrophotographic photosensitive members, it is sought to more improve their electrical properties and photoconductive properties and also to make their performances greatly durable in every environment while maintaining charging performance and sensitivity.

Then, as a result of the achievement of improvements of optical exposure assemblies, developing assemblies, transfer assemblies and so forth in electrophotographic apparatus, having been made in order to improve image characteristics of electrophotographic apparatus, the electrophotographic photosensitive members have become sought to be much more improved in image characteristics than ever.

Under such circumstances, in respect of such subjects, the above prior art has made it possible to uniform the film thickness and film quality to a certain extent, but there is still room for improvement to achieve further improvement in image quality. In particular, as a subject for making amorphous silicon type photosensitive members (light-receiving members) achieve a much higher image quality, it is noted to obtain uniform films and also to prevent any minute faulty images from occurring. As to the minute faulty images, any films having deposited on the part other than the film-forming substrate during film formation, i.e., the inside of a reaction space and the outer surface of the auxiliary substrate, may come off and scatter on the film-forming substrate to cause abnormal growth of the deposited film. This causes occurrence of the minute faulty images when images are formed using such a substrate. Hence, any deposits of films on the part other than the film-forming substrate must be prevented from coming off and scattering on the film-forming substrate.

SUMMARY OF THE INVENTION

Accordingly, an object of the present invention is to solve the problems the prior art has had, and to provide a deposited film forming process and a deposited film forming apparatus by which any deposits of films on the part other than the film-forming substrate can be prevented from coming off and scattering on the film-forming substrate so that deposited films having uniform film thickness and film quality can steadily be formed and also faulty images can be made greatly less occur.

Another object of the present invention is to provide a deposited film forming process and a deposited film forming apparatus which can achieve improvements of various properties of films formed, deposited film forming rate, reproducibility, and productivity of films so that the yield can dramatically be improved when mass production is made.

The deposited film forming process of the present invention comprises forming a deposited film on a film-forming substrate by reduced-pressure vapor phase growth; the film-forming substrate being set on an auxiliary substrate and provided with an auxiliary-substrate cap at the upper part thereof; wherein;

a maximum temperature difference between temperature at the upper end of the film-forming substrate and temperature at the lower end of the auxiliary-substrate cap provided on the film-forming substrate at its upper part is so controlled as to be not greater than a prescribed value so that a film deposited on the auxiliary-substrate cap is improved in adhesion.

The deposited film forming apparatus of the present invention comprises a means for forming a deposited film on a film-forming substrate by reduced-pressure vapor phase growth; the film-forming substrate being set on an auxiliary substrate and provided with an auxiliary-substrate cap at the upper part thereof; wherein;

the auxiliary-substrate cap is provided with a means for preventing the surface temperature thereof from dropping that is attributable to radiation heat conducted from a substrate heating means, so as to make small a maximum temperature difference between temperature at the upper end of the film-forming substrate and temperature at the lower end of the auxiliary-substrate cap.

In these deposited film forming process and apparatus of the present invention, the deposited film may be a deposited film which forms a light-receiving member comprising an amorphous material mainly composed of silicon atoms.

In these deposited film forming process and apparatus of the present invention, the maximum temperature difference may be 15% or less, and preferably 10% or less, of the film-forming substrate temperature.

In these deposited film forming process and apparatus of the present invention, the maximum temperature difference may be a maximum temperature difference between temperature at the upper end of the film-forming substrate at its part within 20 mm from the upper end and temperature at the lower end of the auxiliary-substrate cap at its part within 20 mm from the lower end.

In these deposited film forming process and apparatus of the present invention, the auxiliary-substrate cap may have an outer surface having a surface roughness Rz of 40 $\mu$m or less, and preferably 30 $\mu$m or less.

In these deposited film forming process and apparatus of the present invention, the auxiliary substrate and the auxiliary-substrate cap may each be comprised basically of a metal of the same type as that of the film-forming substrate.

In these deposited film forming process and apparatus of the present invention, the auxiliary substrate and the auxiliary-substrate cap may each be comprised basically of a metal comprising aluminum.

BRIEF DESCRIPTION OF THE DRAWINGS

FIG. 4A is a side cross section of the apparatus, and FIG. 4B a transverse cross section along the line 4B—4B in FIG. 4A.

DESCRIPTION OF THE PREFERRED EMBODIMENTS

Figure 1:
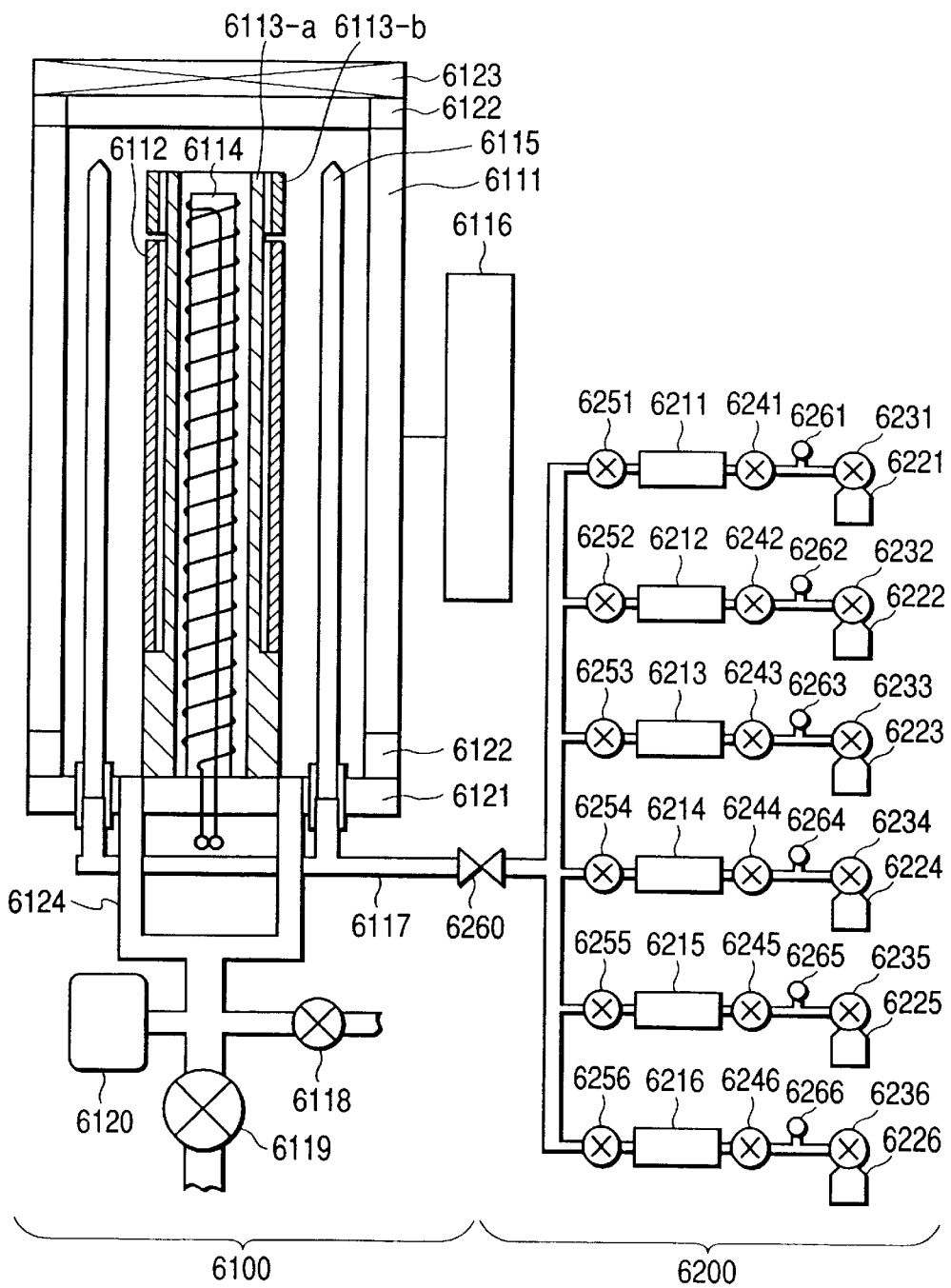
FIG. 1 illustrates an example of an apparatus for producing an electrophotographic light-receiving member.

The present inventors made extensive studies in order to achieve the above object of the present invention in the deposited film forming process and apparatus. As a result, they have discovered that the deposited film may be formed under temperature control so made that a maximum temperature difference between temperature at the upper end of the film-forming substrate and temperature at the lower end of the auxiliary-substrate provided on the film-forming substrate at its upper part is not greater than a prescribed value, and this has a great effect on solving the problem of faulty images.

More specifically, they have discovered that this maximum temperature difference may preferably be 15% or less, and more preferably 10% or less, of the film-forming substrate temperature, and also that a maximum temperature difference between temperature of the film-forming substrate at its part within 20 mm from its upper end and temperature of the auxiliary-substrate cap at its part within 20 mm from its lower end may preferably be 15% or less, and more preferably 10% or less, of the former temperature, and this brings about an improvement in adhesion of the film deposited on the auxiliary substrate, solves the problem of scattering of film fragments on the film-forming substrate from the auxiliary-substrate cap during the formation of deposited film, and prevents faulty images from being caused by the abnormal growth of deposited film around such fragments acting as nuclei, to solve the problem of faulty images. The present invention has been accomplished on the basis of such discovery.

These points will be described below in detail.

In the present invention, the maximum temperature difference between temperature of the film-forming substrate at its part within 20 mm from its upper end and temperature of the auxiliary-substrate cap at its part within 20 mm from its lower end, the auxiliary-substrate cap being provided at the upper part of the film-forming substrate, may be 15% or less, and preferably 10% or less, of the former temperature. This brings about an improvement in adhesion of the film deposited on the auxiliary substrate. Thus, the problem of scattering of film fragments on the film-forming substrate from the auxiliary-substrate cap during the formation of deposited film can be solved, and faulty images, what is called black spots on images, caused by the abnormal growth of deposited film around such fragments acting as nuclei, can be prevented.

The reason therefor is presumed as follows:

When, e.g., an amorphous silicon deposited film is formed on a film-forming substrate by plasma CVD, the reaction can be considered dividedly into three courses, the course of deposition of material gases in the vapor phase, the course of transport of active species from the discharge space to the film-forming substrate surface and the course of surface reaction on the film-forming substrate surface. In particular, the course of surface reaction plays a very great role to determine the structure of completed deposited film. Then, such surface reaction is greatly affected by the temperature, material, shape, adsorbed substance and so forth of the film-forming substrate surface. Taking amorphous silicon as an example, this course of growth on the film-forming substrate can be explained in a little greater detailed as follows: Decomposed species, having been decomposed in plasma and transported, adhere onto the film-forming substrate to form a network of amorphous silicon film. However, on the growth surface of amorphous silicon where any three-dimensional network has not been finished, the elimination of hydrogen atoms, combination of hydrogen atoms or silicon atoms to dangling bonds and rearrangement of atoms having energetically high bonds cause chemical reaction to take place in the direction of less structural defects and stabler energy (the course of relaxation). As the result of these, a decrease in dangling bonds, a lowering of gap level density, and a decrease in Si—$H_2$ bonds which makes Si—H bonds main are seen in the deposited film. Such reaction is controlled by thermal energy of the film-forming substrate, and hence the film-forming substrate temperature during the formation of deposited film is very important. Also, the auxiliary substrate provided at the upper end of the film-forming substrate is provided so that the chemical species decomposed during the formation of deposited film can be prevented from going around the back of the film-forming substrate. In view of the fact that the auxiliary-substrate cap is provided at the upper end of the film-forming substrate, the film deposited on the auxiliary-substrate cap is, with regard to its adhesion, required to have substantially the same film properties as those of the deposited film. Accordingly, the temperature of the auxiliary-substrate cap during the formation of deposited film is also very important.

As methods of heating the film-forming substrate, its vapor phase growth surface may be heated directly by using infrared rays. However, from an industrial viewpoint, it is not practical to provide a heating means on the vapor phase growth side. Accordingly, in usual instances, a heating means is provided on the inside of the auxiliary substrate.

Hence, in order to heat the film-forming substrate and auxiliary-substrate cap to a prescribed temperature, the heat received on the inner face of the auxiliary substrate is so made as to be indirectly transmitted to the film-forming substrate and auxiliary-substrate cap. Also, a substrate member comprising the film-forming substrate, the auxiliary substrate and the auxiliary-substrate cap may preferably stand in non-contact with the heating means because, e.g., the substrate member is rotated in order to make film characteristics uniform. In such a case, the heat is chiefly transmitted by radiation of heat from the heating means to the auxiliary substrate and thereafter transmitted by radiation of heat, or conduction of heat, from the auxiliary substrate to the film-forming substrate and auxiliary-substrate cap.

In that course, the surface temperature of the film-forming substrate and auxiliary-substrate cap may greatly be affected by the shape of a heater the heating means has or the construction of the reactor. Moreover, when the heated film-forming substrate and auxiliary substrate are moved to the reactor through a transport step, a chucking portion at the upper part of the auxiliary substrate is joined with a chucking portion of a conveyor, a transport means, to transport the auxiliary substrate, and hence, the chucking portion of a conveyor is usually made of metal and stands at normal temperature. Accordingly, the upper part of the auxiliary substrate and the auxiliary-substrate cap necessarily undergo the action of heat dissipation caused at the time of contact, so that they come to have a temperature lower than the film-forming substrate to cause a temperature difference.

Thus, the film deposited on the auxiliary-substrate cap has a low temperature during the formation of deposited film and hence, different from the deposited film formed on the film-forming substrate, is a film very tending to come off, so that the film may come off during the formation of deposited film and its film fragments scatter on the film-forming substrate surface. Thus, the areas where the film fragments have adhered act as nuclei to cause abnormal growth of the deposited film around them. This may cause faulty images, what is called black spots on images.

In addition, in view of cost in continuous manufacture, the auxiliary substrate and auxiliary-substrate cap are blasted by liquid honing using glass beads to remove films and so forth having adhered thereto. This is done every time after they are taken out of the reactor after the formation of deposited films, and they are reused. Here, the surfaces of the auxiliary substrate and auxiliary-substrate cap are. necessarily roughened by the blasting.

There is no problem on the auxiliary substrate from the viewpoint of the heat radiation for making the film-forming substrate and auxiliary-substrate cap conduct heat, even if its surface has been roughened to a certain extent. However, the auxiliary-substrate cap, whose surface is thus roughened, comes to have a larger surface area than the film-forming substrate, so that, even if heated equally to the film-forming substrate, the auxiliary-substrate cap comes to have a low temperature because of a difference in the amount of heat dissipating from the surface side which difference is due to the difference in surface area. This tendency is especially high especially in view of the fact that the auxiliary-substrate cap is provided at the upper end of the film-forming substrate.

The present invention was made as a result of extensive studies on this temperature difference. Thus, the maximum temperature difference between temperature at the upper end of the film-forming substrate and temperature at the lower end of the auxiliary-substrate cap provided at the upper part of the film-forming substrate is so controlled as to be 15% or less, and preferably 10% or less, of the former temperature. This prevents the faulty images, what is called black spots on images, from being caused by the film coming off the auxiliary-substrate cap during the formation of deposited film and scattering as film fragments on the film-forming substrate surface to cause abnormal growth of the deposited film around areas where the film fragments have adhered, acting as nuclei. Especially when there is an abrupt temperature difference between the film-forming substrate and the vicinity of the auxiliary-substrate cap, such faulty images may more remarkably occur because of a difference in stress of the films deposited. Accordingly, with regard to this temperature difference, what is important is a maximum temperature difference between the part within 20 mm from the upper end of the film-forming substrate and the part within 20 mm from the lower end of the auxiliary-substrate cap when stated generally, though various conditions must be taken into account.

Since the temperature difference in this vicinity is caused by the difference in surface area that is ascribable to the difference in surface roughness between the film-forming substrate and the auxiliary-substrate cap, it is preferable to take note of the surface roughness in order to control such a temperature difference. The auxiliary-substrate cap may have an outer surface having a surface roughness Rz of 40 $\mu$m or less, and preferably 30 $\mu$m or less. This lessens the drop of surface temperature of the auxiliary-substrate cap, and enables formation of the deposited film in a state close to the surface temperature of the film-forming substrate. Thus, the films deposited on the surfaces of the film-forming substrate and auxiliary-substrate cap can be substantially equal, so that the faulty images, what is called black spots on images, can be prevented from being caused by the film coming off the auxiliary-substrate cap during the formation of deposited film and scattering as film fragments on the film-forming substrate surface to cause abnormal growth of the deposited film around areas where the film fragments have adhered, acting as nuclei. The auxiliary-substrate cap may preferably have the above surface roughness also because any excessive surface roughness may cause not only a temperature drop but also adhesion of dust.

The auxiliary-substrate cap and the auxiliary substrate may be comprised basically of a metal of the same type as that of the film-forming substrate. It is common to use aluminum or aluminum alloy as a material for film-forming substrates of light-receiving members. Accordingly, the auxiliary-substrate cap and the auxiliary substrate may preferably be comprised basically of aluminum.

In order to gain the heat efficiently from the heating means, the auxiliary substrate may also preferably have an inner surface constituted of a ceramic material. The ceramic material of the inner surface of the auxiliary substrate may preferably be constituted of at least one of a material having a good acid resistance and a material readily capable of receiving radiation heat. As an example of the ceramic material of the inner surface of the auxiliary substrate, it may include a mixture of $Al_2O_3$ and $Cr_2O_3$.

Figure 2:
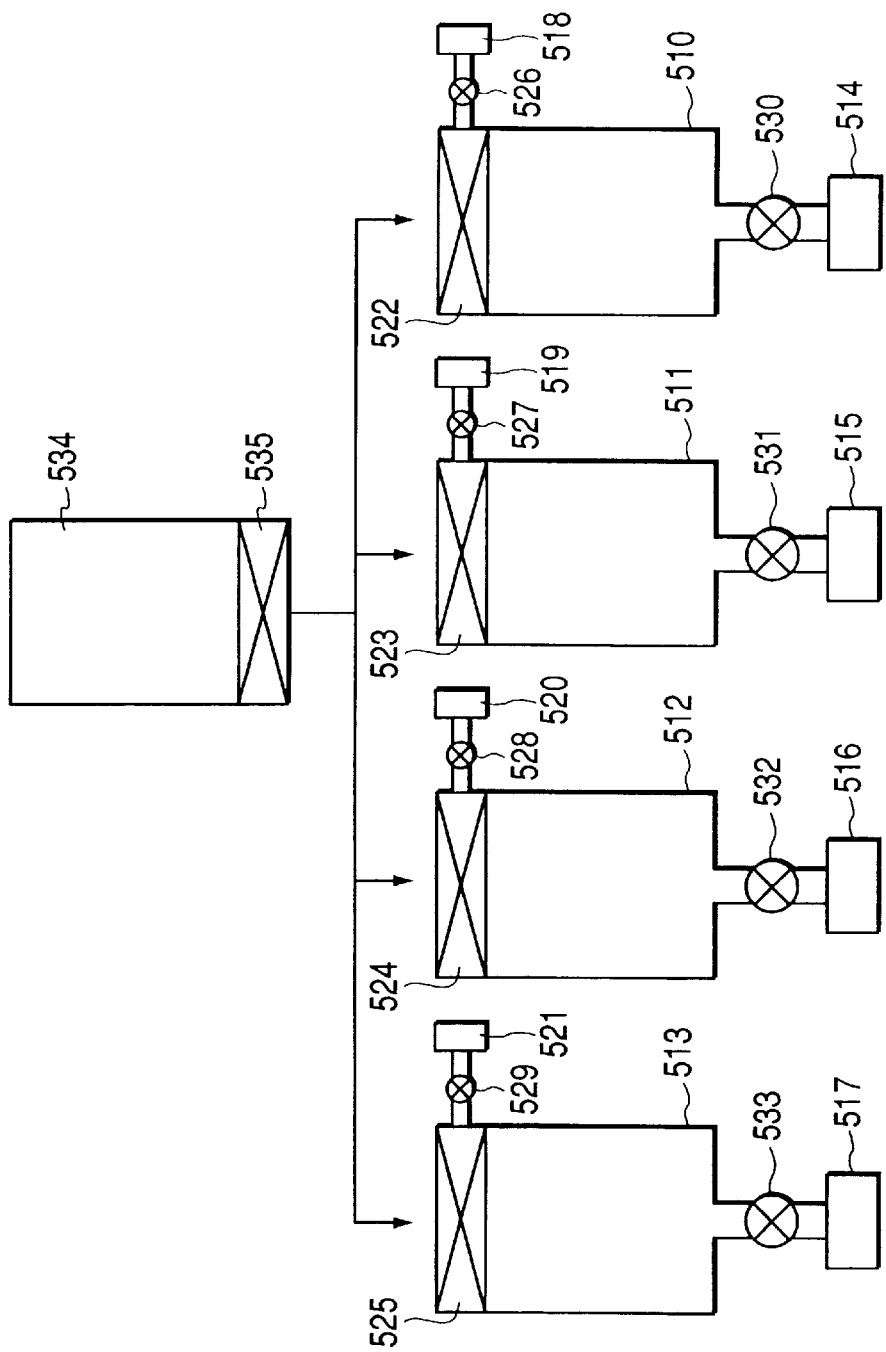
FIG. 2 also illustrates an example of an apparatus for producing an electrophotographic light-receiving member.

The present invention is also effective in a light-receiving member production apparatus having vacuum chambers exclusively used for individual processing, e.g., those shown in FIG. 2.

The apparatus shown in FIG. 2 will be described. FIG. 2 diagrammatically illustrates the whole disposition of a deposited film forming apparatus. Reference numeral 510 denotes a vacuum loading chamber in which in a clean atmosphere a film-forming substrate is set on an auxiliary substrate comprised basically of a metal and a vacuum is produced. Reference numeral 511 denotes a vacuum heating chamber in which the film-forming substrate is heated to, and kept at, a prescribed temperature; 512, a vacuum reaction chamber in which the deposited film is formed; and 513, a vacuum cooling chamber in which the film-forming substrate is cooled after the formation of deposited film so as to be taken out. Reference numeral 534 denotes a vacuum transport chamber which moves the auxiliary substrate or the auxiliary substrate and film-forming substrate to the respective positions of processing chambers, vacuum loading chamber 510, vacuum heating chamber 511, vacuum reaction chamber 512 and vacuum cooling chamber 513.

Reference numerals 514, 515, 516 and 517 denote exhaust means for evacuating the respective processing chambers; 518, 519, 520 and 521, exhaust means for evacuating the internal spaces of a gate valve 535 and gate valves 522, 523, 524 and 525 when the vacuum transport chamber 534 is connected with the processing chambers, i.e., the vacuum loading chamber 510, vacuum heating chamber 511, vacuum reaction chamber 512 and vacuum cooling chamber 513. For example, the auxiliary substrate having the film-forming substrate set thereon is put in and out of the vacuum reaction chamber 512 in the following way: The gate valve of the vacuum transport chamber 534 is brought into close contact with the top of the gate valve 523, and the space between the gate valves 535 and 523 is evacuated by means of the vacuum means 519. Next, the gate valves 523 and 535 are opened, and the film-forming substrate, having been heated, is transported together with the auxiliary substrate from the inside of the vacuum heating chamber 511 to the inside of the vacuum transport chamber 534 by means of a vertical movement mechanism (not shown) provided inside the vacuum transport chamber 534. Thereafter, the gate valves 523 and 535 are closed, and the vacuum transport chamber 534 is moved to the position facing the vacuum reaction chamber 512. Subsequently, the like operation is repeated to transport the auxiliary substrate having the film-forming substrate set thereon, into the vacuum reaction chamber 512. It is transported usually in a time of 3 to 10 minutes.

Thereafter, in the vacuum reaction chamber 512, the deposited film is formed on the film-forming substrate in the manner as described previously. Then, finally the auxiliary substrate having the film-forming substrate set thereon is transported into the vacuum cooling chamber 513. After the film-forming substrate has been cooled in the vacuum cooling chamber 513 the inside of the vacuum cooling chamber 513 is returned to the atmospheric pressure, where the film-formed substrate is taken out.

The reason why the present invention is effective also in the light-receiving member production apparatus having such vacuum chambers exclusively used for individual processing is as follows: The auxiliary substrate having been heated in the vacuum heating chamber 511 is transferred while chucking portion at the upper part of the auxiliary substrate is joined with a chucking portion of a conveyor provided in the vacuum transport chamber 534. Since the chucking portion of the conveyor is made of metal and also stands at normal temperature, the upper part of the auxiliary substrate and the auxiliary-substrate cap necessarily undergo the action of heat dissipation caused at the time of contact of the conveyor with the chucking portion, to come to have a low temperature locally. Thus, the transfer of the auxiliary substrate heated before the formation of deposited film makes the temperature of the auxiliary-substrate cap lower than that of the film-forming substrate during the transfer. Even under such a temperature difference, the auxiliary-substrate cap having a surface roughness Rz of 40 $\mu$m or less, and preferably 30 $\mu$m or less, lessens the heat dissipation from the auxiliary-substrate at the stage of heating and transfer, so that the temperature can be prevented from dropping. Namely, these are put into the vacuum reaction chamber 512 in a state substantially free of temperature difference between the film-forming substrate and the auxiliary-substrate cap, in the state of which the deposited film is formed.

The production of a light-receiving member by the process of the present invention will be described below in greater detail by giving a specific example.

Figure 3A:
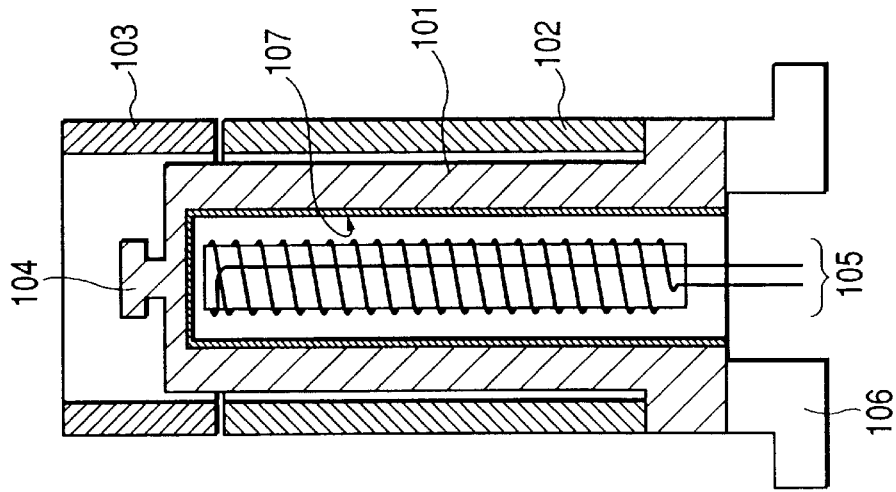
FIGS. 3A and 3B are diagrammatic illustrations of the construction of preferred embodiments for the production of a light-receiving member by the deposited-film forming process of the present invention.
Figure 3B:
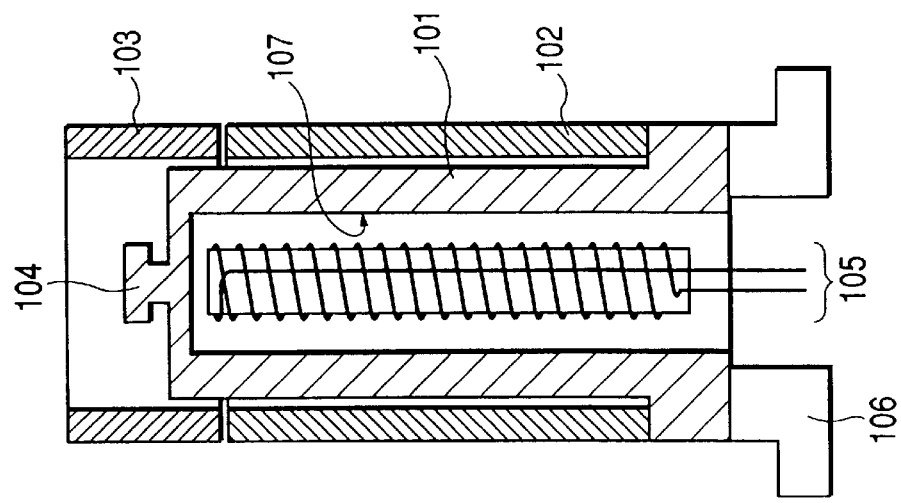

FIGS. 3A and 3B are diagrammatic illustrations used to describe the production of a light-receiving member by the process of the present invention, showing examples of substrate supports in their partially cross-sectional views.

Reference numeral 101 denotes an auxiliary substrate; 103, an auxiliary-substrate cap; and 102 a film-forming substrate.

The auxiliary substrate 101 receives radiation heat directly from a heating means 105. The heat is transmitted through the interior of the auxiliary substrate 101 by heat conduction, further transmitted to the outer surface of the auxiliary substrate 101, and finally transmitted to the film-forming substrate 102 set thereon and the auxiliary-substrate cap 103. Contrary to this heat conduction and heat radiation, heat dissipation takes place on the surface sides of the film-forming substrate 102 and auxiliary-substrate cap 103. The amount of heat dissipation differs because of the difference in surface roughness between these film-forming substrate 102 and auxiliary-substrate cap 103. Hence, the auxiliary-substrate cap 103 having a large surface roughness comes to have a lower surface temperature than the film-forming substrate 102. This causes a temperature difference between the film-forming substrate 102 and the auxiliary-substrate cap 103 in its vicinity of the film-forming substrate 102. Taking account of these points, the auxiliary-substrate cap 103 is made to have a surface roughness Rz of 40 $\mu$m or less, and preferably 30 $\mu$m or less, as described above. Thus, the surface temperature of the auxiliary-substrate cap 103 is prevented from dropping, to make small its temperature difference from the film-forming substrate 102.

With regard to the part of a stand 106, this may be replaced with a stand serving also as a column of a heater 105. The film-forming substrate 102 and the auxiliary substrate 101 may preferably be brought into contact in order to improve heat conduction, or may have a gap (a space) between them to a tolerable extent. Also, as shown in FIG. 3B, the surface of inner wall 107 of the auxiliary substrate 101 may be constituted of a ceramic material.

The auxiliary substrate 101 and the auxiliary-substrate cap 103 may comprise a material of the same type as that of the film-forming substrate 102. This is preferred in view of uniformity because they can have equal volume changes due to thermal expansion and their close contact with the film-forming substrate or the gap between them and the film-forming substrate can be kept stably. As materials for the metal basically constituting the auxiliary substrate 101 and auxiliary-substrate cap 103, it may include, e.g., as those preferably usable, metals such as Al, Cr, Mo, Au, In, Nb, Te, V, Ti, Pt, Pd and Fe, and alloys of any of these, e.g., stainless steel. Taking account of the fact that the film-forming substrate is made of aluminum or an aluminum alloy, aluminum or an aluminum alloy is suited.

With regard to the surface roughness of the outer surface of the auxiliary substrate 101, it is better for the surface to be rough in order to attain a larger surface area and an efficient radiation heat. On the other hand, making surface roughness larger to make surface area larger may result in an increase in dust, tending to cause dusting in some cases. Accordingly, its surface may preferably have a ten-point average roughness (Rz) of from 5 to 200 $\mu$m, and more preferably from 10 to 90 $\mu$m. Such surface properties may also preferably be uniform over the in-plane whole surface, but may be of no problem in practical use so long as the difference between maximum value and minimum value in the in-plane is within 100 $\mu$m.

With regard to the thickness (wall thickness) of the auxiliary substrate 101 and the auxiliary-substrate cap 103, there are no particular limitations thereon so long as they do not deform while they hold the film-forming substrate 102. Taking account of practical factors such as cost, handling properties, strength, heating time and heating temperature, they may each preferably have a thickness of from 0.5 to 30 mm, and more preferably from 1 to 20 mm.

The auxiliary substrate 101 may be formed in a length larger than the film-forming substrate 102 at least. This is preferred in view of uniformity of the film formed and handling properties. The length of the auxiliary substrate 101 depends on the apparatus to be set up and can not be said sweepingly. Taking account of cost and so forth, in an instance where one film-forming substrate is set on one auxiliary substrate, the auxiliary substrate may preferably be in a length of from 100 to 200, and more preferably from 110 to 170, assuming the length of the film-forming substrate as 100. In an instance where a plurality of film-forming substrates are set on one auxiliary substrate, the total of the length of deposited-film forming surfaces of a plurality of film-forming substrates may stand in the above relationship.

The auxiliary substrate 101 may preferably be provided with a transport chucking portion 104 as shown in FIGS. 3A and 3B, which is formed in order to carry the auxiliary substrate or transport the film-forming substrate. Incidentally, it may have any shape having a projection or a recession so long as the chucking for transport can be performed accurately and surely.

In the present invention, the auxiliary substrate 101 whose inner surface is constituted of a ceramic material enables the conduction of heat more efficiently and is effective for improving the uniformity of characteristics and making faulty images less occur.

There are no particular limitations on the ceramic material constituting the inner surface 107 of the auxiliary substrate 101. It may include, e.g., $Al_2O_3$, $Cr_2O_3$, MgO, $TiO_2$ and $SiO_2$. Materials having a good acid resistance, such as $Al_2O_3$ and $Cr_2O_3$, are preferred in view of corrosion resistance to compounds containing halogen atoms ($F_2$, $ClF_3$, $SiF_4$, etc.) which are used in the production of light-receiving members comprising a-Si. Materials readily capable of receiving radiation heat, such as WC, TaN and $Cr_2O_3$, are also preferred because they are little affected even by any change occurring more or less in nature of the surface. Also, a mixed material of the material having a good acid resistance and the material readily capable of receiving radiation heat is more preferred.

When such a mixed material is used, and the material having a good acid resistance is represented by a (g) and the material readily capable of receiving radiation heat by b (g), the both materials may be mixed in a ratio of a:b of from 1:99 to 99:1, and more preferably from 10:90 to 90:10.

The ceramic material constituting the inner surface 107 of the auxiliary substrate 101 may preferably have a void of from 1 to 20%, and more preferably from 1 to 15%, in order to improve heat resistance and prevent adsorption of moisture content.

With regard to surface properties of the ceramic material constituting the inner surface 107 of the auxiliary substrate 101, it is better for the surface to be rough in order to attain a larger surface area and an efficient radiation heat. On the other hand, making surface roughness larger to make surface area larger may result in an increase in dust, tending to cause dusting in some cases. Accordingly, its surface may preferably have a ten-point average roughness (Rz) of from 5 to 200 $\mu$m, and more preferably from 10 to 90 $\mu$m. Such surface properties may also preferably be uniform over the in-plane whole surface, but may be of no problem in practical use so long as the difference between maximum value and minimum value in the in-plane is within 100 $\mu$m.

There are no particular limitations on the means by which the inner surface 107 of the auxiliary substrate 101 is formed using the ceramic material, which may include CVD processes, and surface coating processes such as plating and flame spraying. In particular, flame spraying is more preferred in view of cost or because it may hardly be restricted by the size and shape of the coating targets. Plasma flame spraying is especially more preferred because of a low void and a good adhesion. Also, a cylinder comprised of the ceramic material may be so provided as to be in close contact with the inner surface of the auxiliary substrate made of metal.

In the case where the inner surface 107 of the auxiliary substrate 101 is formed using the ceramic material, the inner surface is cleaned and thereafter the ceramic material is formed on the metal surface by the above means. In order to improve adhesion, a subbing layer formed of, e.g., a mixed material of Al and Ti may preferably be provided between the ceramic material and the metal surface.

The ceramic material may preferably be so provided as to cover the whole inner surface of the auxiliary substrate 101, but there may partly be surface not covered with it for the purpose of grounding the auxiliary substrate.

There are no particular limitations on the thickness of the ceramic material constituting the inner surface 107 of the auxiliary substrate 101. In order to improve durability and uniformity and also in view of heat conductivity and production cost, it may preferably be in a thickness of from 10 to 10,000 $\mu$m, and more preferably from 20 to 5,000 $\mu$m.

The film-forming substrate 102 used in the present invention may be made of a metal such as Al, Cr, Mo, Au, In, Nb, Te, V, Ti, Pt, Pb or Fe, or an alloy of any of these, as exemplified by stainless steel. In particular, Al or Al alloy is suited for the present invention. Also usable are substrates comprising an electrically insulating support having been subjected to conductive treatment at least on the side the light-receiving layer is formed, which may include a film or sheet of synthetic resin such as polyester, polyethylene, polycarbonate, cellulose acetate, polypropylene, polyvinyl chloride, polystyrene or polyamide, or glass or ceramic. Such a support may also be subjected to conductive treatment also on the side opposite to the side the light-receiving layer is formed.

The film-forming substrate may have a smooth surface or uneven surface. Its thickness may appropriately be so determined that the light-receiving member can be formed as desired. In instances where the light-receiving member is required to have a flexibility, the film-forming substrate may be made as thin as possible so long as it can well function as the film-forming substrate. In usual instances, however, the film-forming substrate may have a thickness of 100 µm or more in view of its manufacture and handling, mechanical strength and so forth.

When images are recorded using coherent light such as laser light, the surface of the film-forming substrate may be made uneven so that any faulty images due to what is called interference fringes appearing in visible images can be canceled.

The unevenness made on the surface of the film-forming substrate can be produced by the known methods as disclosed in, e.g., Japanese Patent Application Laid-Open No. 60-168156, No. 60-178457 and No. 60-225854.

As another method for canceling the faulty images due to interference fringes occurring when the coherent light such as laser light is used, the surface of the film-forming substrate may be made uneven by making a plurality of sphere-traced concavities (e.g., dimples) on its surface. More specifically, the surface of the film-forming substrate has an unevenness made more finely uneven than the resolving power required for the light-receiving member and also such unevenness is formed by a plurality of sphere-traced concavities. The unevenness formed by a plurality of sphere-traced concavities on the surface of the film-forming substrate can be produced by the known method as disclosed in Japanese Patent Application Laid-Open No. 61-231561.

The light-receiving layer comprised of a-Si, of the light-receiving member in the present invention, may be incorporated with silicon atoms, and hydrogen atoms or halogen atoms, and in addition thereto Group III atoms such as boron or gallium, Group V atoms such as nitrogen, phosphorus or arsenic, oxygen atoms, carbon atoms and germanium atoms, alone or in appropriate combination as a component for controlling Fermi levels or forbidden bands.

The light-receiving layer may also be made to have a multi-layer configuration by providing a charge injection blocking layer for the purpose of improving adhesion to the film-forming substrate or controlling electric-charge receptivity, or a surface layer for the purpose of protecting the surface or preventing electric charges from being injected from the surface.

In the present invention, the light-receiving layer is formed by a vacuum deposition process such as sputtering, thermal CVD, photo-assisted CVD or plasma CVD.

Examples of the process and apparatus for forming deposited films by high-frequency plasma CVD, microwave plasma CVD and VHF plasma CVD will be described below in detail.

Figure 5:
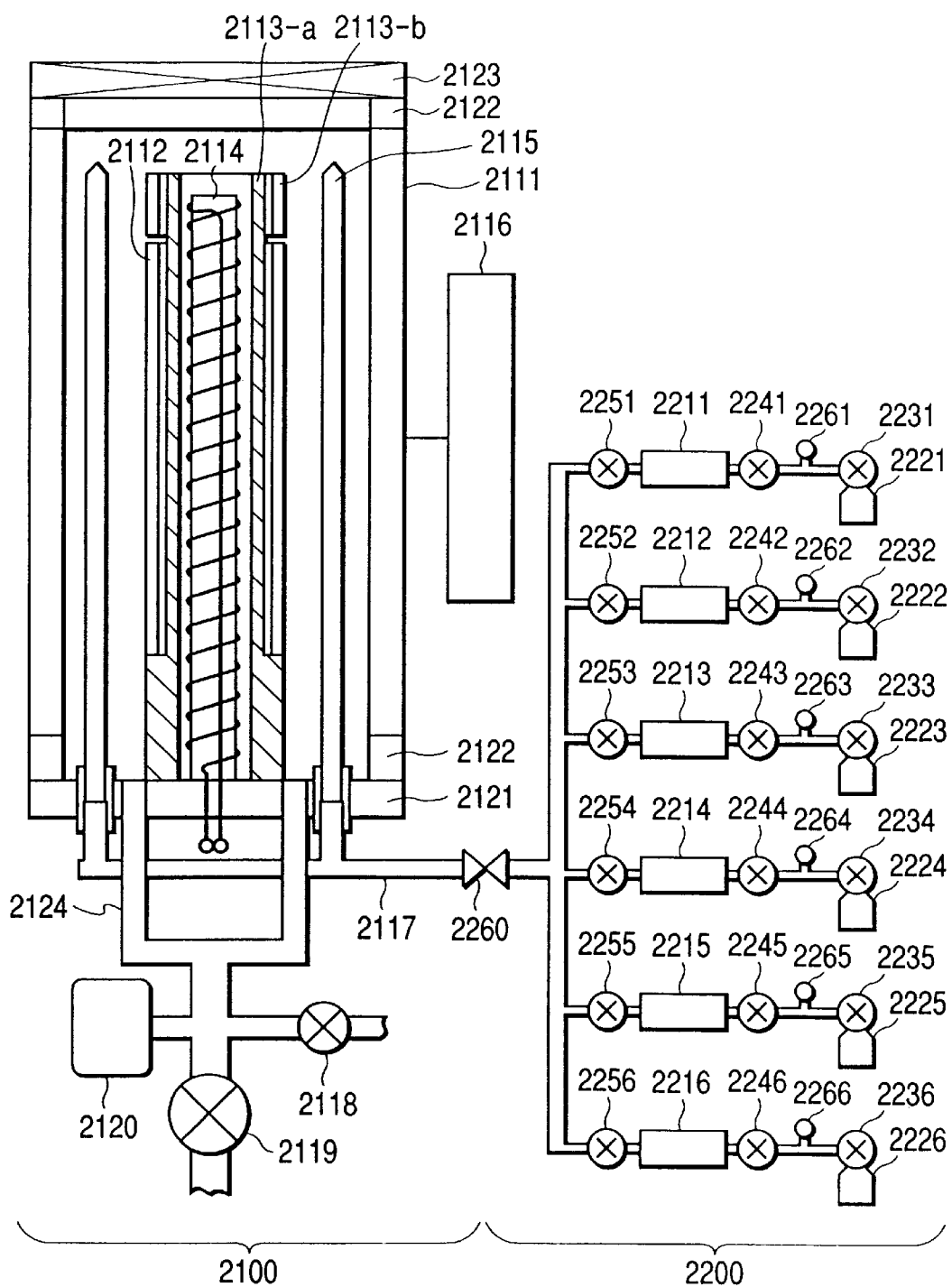
FIG. 5 illustrates an example of an apparatus for producing an electrophotographic light-receiving member by the process of the present invention, which diagrammatically illustrates an apparatus for producing an electrophotographic light-receiving member by radio frequency (RF) glow discharging.

FIG. 5 is a diagrammatic illustration showing an example of an apparatus for producing an electrophotographic light-receiving member by a deposited film forming process using high-frequency plasma CVD (hereinafter "RF-PCVD").

The production apparatus shown in FIG. 5, employing the deposited film forming process carried out by RF-PCVD is constituted like the one shown in FIG. 1 as described previously. Stated roughly, this apparatus is constituted of a deposition system 2100, a material gas feed system 2200 and an exhaust system (not shown) for evacuating the inside of a reactor 2111. In the reactor 2111 in the deposition system 2100, a conductive, film-forming cylindrical substrate 2112 set on an auxiliary substrate 2113-*a* comprised basically of metal is placed, and an auxiliary-substrate cap 2113-*b* is provided on the film-forming cylindrical substrate. A heater 2113 for heating the substrates and a material gas feed pipe 2115 are provided, and a power applying means 2116 is also connected via a high-frequency matching box (not shown).

The material gas feed system 2200 is constituted of gas cylinders 2221 to 2226 for material gases such as $SiH_4$, $H_2$, $CH_4$, NO, $B_2H_6$ and $GeH_4$, valves 2231 to 2236, 2241 to 2246 and 2251 to 2256, and mass flow controllers 2211 to 2216. The gas cylinders for the respective material gases are connected to the gas feed pipe 2115 in the reactor 2111 through a valve 2260.

The deposited film can be formed using this apparatus in the following way, for example.

First, the film-forming cylindrical substrate 2112 set on the auxiliary substrate 2113-*a* serving as a substrate holder, comprised basically of metal and having been blackened on the outer surface at its specific area, is set in the reactor 2111, and the inside of the reactor 2111 is evacuated by an exhaust means (e.g., a vacuum pump, not shown). Subsequently, the substrate heater 2114 is set "on". Then, the inner surface of the auxiliary substrate 2113-*a* receives radiation heat directly from the substrate heater 2114. The heat received at its inner surface is transmitted by heat conduction through the interior of the metal which constitutes the auxiliary substrate 2113-*a* basically, is further transmitted to the outer surface of the auxiliary substrate 2113-*a*, and is finally transmitted to the surfaces of the film-forming cylindrical substrate 2112 set thereon and auxiliary-substrate cap 2113-*b*. The heat conduction and heat radiation taking place at this stage is so controlled that the maximum temperature difference between the surface temperature of the film-forming cylindrical substrate 2112 and the surface temperature of the auxiliary-substrate cap 2113-*b* is 15% or less, and more preferably 10% or less, of the former temperature, and the surface temperature of the film-forming cylindrical substrate 2112 is controlled at a prescribed temperature of from 50° C. to 500° C.

Before material gases for forming deposited films are flowed into the reactor 2111, gas cylinder valves 2231 to 2236 and a leak valve 2118 of the reactor are checked to make sure that they are closed, and also flow-in valves 2241 to 2246, flow-out valves 2251 to 2256 and an auxiliary valve 2260 are checked to make sure that they are opened. Then, a main valve 2119 is first opened to evacuate the insides of the reactor 2111 and a gas feed pipe 2117.

Next, at the time a vacuum gauge 2120 has been read to indicate a pressure of about $6.7 \times 10^{-4}$ Pa, the auxiliary valve 2260 and the flow-out valves 2251 to 2256 are closed. Thereafter, gas cylinder valves 2231 to 2236 are opened so that gases are respectively introduced from gas cylinders 2221 to 2226, and each gas is controlled to have a pressure of. e.g., 2 kg/cm² by operating pressure controllers 2261 to 2266. Next, the flow-in valves 2241 to 2246 are slowly opened so that gases are respectively introduced into mass flow controllers 2211 to 2216.

After the film formation is thus ready to start through the above procedure, layers as exemplified by the charge injection blocking layer, the photosensitive layer and the surface layer are formed on the film-forming cylindrical substrate 2112.

At the time the film-forming cylindrical substrate 2112 has had a prescribed temperature, some necessary flow-out valves among the flow-out valves 2251 to 2256 and the auxiliary valve 2260 are slowly opened so that prescribed material gases are fed into the reactor 2111 from the gas cylinders 2221 to 2226 through a gas feed pipe 2115. Next, the mass flow controllers 2211 to 2216 are operated so that each material gas is adjusted to flow at a prescribed rate. In that course, the divergence of the main valve 2118 is so adjusted that the pressure inside the reactor 2111 comes to be a prescribed pressure of not higher than 133 Pa or below while watching the vacuum gauge 2120.

At the time the internal pressure has become stable, an RF power source (not shown) of the power applying means 2116 is set at a desired electric power, and an RF power is supplied into the reactor 2111 through the high-frequency matching box (not shown) to cause RF glow discharge to take place. The material gases fed into the reactor 2111 are decomposed by the discharge energy thus produced, so that a prescribed deposited film mainly composed of silicon is formed on the film-forming cylindrical substrate 2112. After a film with a desired film thickness has been formed, the supply of RF power is stopped, and the flow-out valves 2251 to 2256 are closed to stop material gases from flowing into the reactor 2111. Thus, the formation of the photoconductive layer is completed.

The same operation is repeated plural times, whereby a light-receiving layer with the desired multi-layer structure can be formed.

Needless to say, when the corresponding layers are formed, the flow-out valves other than those for necessary gases are all closed. Also, in order to prevent the corresponding gases from remaining in the reactor 2111 and in the pipe extending from the flow-out valves 2251 to 2256 to the reactor 2111, the flow-out valves 2251 to 2256 are closed, the auxiliary valve 2260 is opened and then the main valve 2119 is full-opened so that the inside of the system is once evacuated to a high vacuum; this may be optionally operated.

In order to achieve uniform film formation, the film-forming cylindrical substrate 2112 may be rotated at a prescribed speed by means of a driving mechanism (not shown) while the films are formed.

Needless to say, the gas species and valve operations described above are changed according to the conditions under which each layer is formed.

The film-forming cylindrical substrate 2112 may be heated by any means so long as it is a heating element of a vacuum type, specifically including electrical resistance heaters such as a sheathed-heater winding heater, a plate heater and a ceramic heater, heat radiation lamp heating elements such as a halogen lamp and an infrared lamp, and heating elements comprising a heat exchange means employing a liquid or gas as a hot medium. As surface materials of the heating means, metals such as stainless steel, nickel, aluminum and copper, ceramics, or heat-resistant polymer resins may be used. As another method that may be used, a chamber exclusively used for heating may be provided in addition to the reactor 2112 as in the apparatus constituted as shown in FIG. 2, and the film-forming cylindrical substrate 2112 having been heated therein may be transported into the reactor 2112 in vacuo.

In the RF-CVD, the gas pressure inside the reactor may appropriately be selected within an optimum range in accordance with the designing of layer configuration. In usual instances, the pressure may be controlled in the range of from $1 \times 10^{-2}$ Pa to 1,330 Pa, preferably from 6.7 Pa$\times 10^{-2}$ to 670 Pa, and most preferably from $1 \times 10^{-1}$ Pa to 133 Pa.

The discharge power may also be appropriately selected within an optimum range in accordance with the designing of layer configuration, where the discharge power with respect to the flow rate of Si-feeding gas may usually be set in the range of from 0.1 to 7 times, preferably from 0.5 to 6 times, and most preferably from 0.7 to 5 times.

The temperature of the film-forming cylindrical substrate 2112 may also be appropriately selected within an optimum range in accordance with the designing of layer configuration. The temperature may preferably be set in the range of from 200 to 350° C.

A process for producing an electrophotographic light-receiving member by forming deposited films by microwave plasma CVD (hereinafter "$\mu$W-PCVD") will be described below.

Figure 4A:
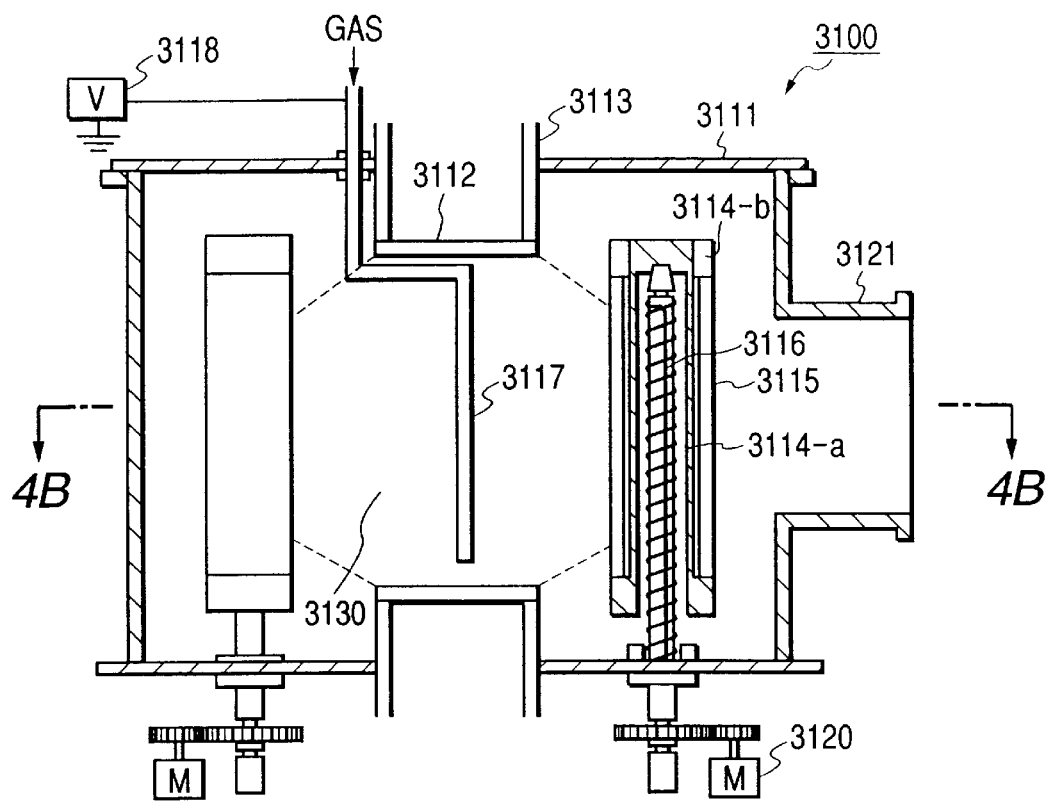
FIGS. 4A and 4B illustrate an example of an apparatus for producing an electrophotographic light-receiving member by the process of the present invention, which diagrammatically illustrate an apparatus for producing an electrophotographic light-receiving member by microwave ($\mu$W) glow discharging.
Figure 4B:
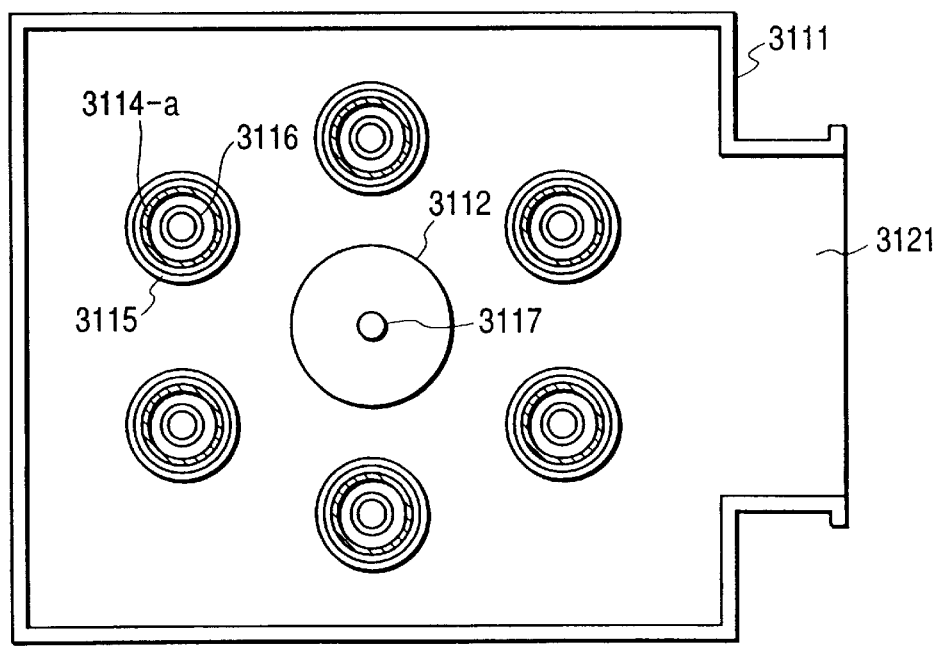

The deposition system 2100 employing RF-PCVD in the production process shown in FIG. 5 is replaced with a deposition system 3100 shown in FIGS. 4A and 4B, which is then connected with the material gas feed system 2200, thus an apparatus for producing an electrophotographic light-receiving member by $\mu$W-PCVD can be set up.

This apparatus is constituted of a reactor 3111 having a vacuum-closed structure and capable of being evacuated, and the material gas feed system and an exhaust system (not shown) for evacuating the inside of the reactor 3111. In the reactor 3111, microwave power can be introduced through a microwave guide-in window 3112 formed of a material capable of transmitting microwave power into the reactor in a good efficiency and also maintaining the vacuum hermetic state via a microwave waveguide 3113 connected to a microwave power source (not shown) through a stub tuner (not shown) and an isolator (not shown). Also, in the reactor 3111, a deposited-film-forming cylindrical substrate 3115 set on an auxiliary substrate 3114-$a$ comprised basically of metal is placed in plurality, and an auxiliary-substrate cap 3114-$b$ is set on each film-forming cylindrical substrate 3115. A heater 3116 for heating the substrates and a material gas feed pipe 3117 serving as both a material gas feed means and an electrode for imparting external electric bias used to control plasma potential are also provided. The inside of the reactor 3111 is connected to, e.g., a diffusion pump (not shown) through an exhaust pipe 3121.

As the material gas feed system, the material gas feed system 2200 shown in FIG. 5 may be applied. Accordingly, it may be constituted of gas cylinders 2221 to 2226 for material gases such as $SiH_4$, $H_2$, $CH_4$, NO, $B_2H_6$ and SiF4, valves 2231 to 2236, 2241 to 2246 and 2251 to 2256, and mass flow controllers 2211 to 2216. The gas cylinders for the respective material gases are connected to the gas feed pipe 2115 in the reactor 2111 through the valve 2260. A space 2130 surrounded by the film-forming cylindrical substrates 2115 forms a discharge space.

The deposited film can be formed using this $\mu$W-PCVD apparatus in the following way.

First, the film-forming cylindrical substrate 3115 set on the auxiliary substrate 3114-$a$ comprised basically of metal is set in the reactor 3111. The auxiliary-substrate cap 3113-$b$ is provided on the film-forming cylindrical substrate 3115. The film-forming cylindrical substrate 3115 is rotated by a drive means 3120, and the inside of the reactor 3111 is evacuated through an exhaust pipe 3121 to adjust the internal pressure of the reactor 3111 to $1 \times 10^{-6}$ Torr or below. Subsequently, the substrate heater 3116 is set "on". Then, the inner surface of the auxiliary substrate 3114-$a$ receives radiation heat directly from the substrate heater 3116. The heat received at its inner surface is transmitted by heat conduction through the interior of the metal which constitutes the auxiliary substrate 3114-$a$ basically, is further transmitted to the outer surface of the auxiliary substrate 3114-$a$, and is finally transmitted to the surfaces of the film-forming cylindrical substrate 3115 set thereon and auxiliary-substrate cap 3114-*b*. The heat conduction and heat radiation taking place at this stage is so controlled that the maximum temperature difference between the surface temperature of the film-forming cylindrical substrate 3115 and the surface temperature of the auxiliary-substrate cap 3114-*b* is 15% or less, and more preferably 10% or less, of the former temperature, and the surface temperature of the film-forming cylindrical substrate 3115 is controlled at a prescribed temperature of from 50° C. to 500° C.

Before material gases for forming deposited films are flowed into the reactor 3111, gas cylinder valves 2231 to 2236 and a leak valve (not shown) of the reactor are checked to make sure that they are closed, and also flow-in valves 2241 to 2246, flow-out valves 2251 to 2256 and an auxiliary valve 2260 are checked to make sure that they are opened. Then, a main valve (not shown) is first opened to evacuate the insides of the reactor 3111 and a gas feed pipe (not shown).

Next, at the time a vacuum gauge (not shown) has been read to indicate a pressure of about $6.7 \times 10^{-4}$ Pa, the auxiliary valve 2260 and the flow-out valves 2251 to 2256 are closed. Thereafter, gas cylinder valves 2231 to 2236 are opened so that gases are respectively introduced from gas cylinders 2221 to 2226, and each gas is controlled to have a pressure of, e.g., 2 kg/cm$^2$ by operating pressure controllers 2261 to 2266. Next, the flow-in valves 2241 to 2246 are slowly opened so that gases are respectively introduced into mass flow controllers 2211 to 2216.

After the film formation is thus ready to start through the above procedure, layers such as the charge injection blocking layer, the photosensitive layer and the surface layer are formed on each film-forming cylindrical substrate 3115.

At the time the film-forming cylindrical substrate 3115 has had a prescribed temperature, some necessary flow-out valves among the flow-out valves 2251 to 2256 and the auxiliary valve 2260 are slowly opened so that prescribed material gases are fed into the discharge space 3130 in the reactor 3111 from the gas cylinders 2221 to 2226 through a gas feed pipe 3117. Next, the mass flow controllers 2211 to 2216 are operated so that each material gas is adjusted to flow at a prescribed rate. In that course, the divergence of the main valve (not shown) is so adjusted that the pressure inside the discharge space 3130 comes to be a prescribed pressure of not higher than 133 Pa or below while watching the vacuum gauge (not shown).

At the time the internal pressure has become stable, an RF power source (not shown) is put on to generate microwaves with a frequency of 500 MHz or above, preferably 2.45 GHz, and microwave energy is introduced into the discharge space 3130 through the microwave guide-in window 3112 to cause microwave glow discharge to take place. Concurrently therewith, an electric bias, e.g., DC is applied from a power source to the gas feed pipe 3117 serving also as an electrode. Thus, in the discharge space 3130 surrounded by the film-forming cylindrical substrates 3115, the material gases fed into it are excited by microwave energy to undergo dissociation, so that the desired deposited film is formed on each film-forming cylindrical substrate 3115. In this course, each substrate is rotated at the desired rotational speed by means of a substrate rotating motor 3120 so that the layer can be formed uniformly.

After films with desired film thickness have been formed, the supply of microwave power is stopped, and the flow-out valves are closed to stop material gases from flowing into the reactor 3111. Thus, the formation of the deposited films is completed.

The same operation is repeated plural times, whereby light-receiving layers with the desired multi-layer structure can be formed.

Needless to say, when the corresponding layers are formed, the flow-out valves other than those for necessary gases are all closed. Also, in order to prevent the corresponding gases from remaining in the reactor 3111 and in the pipe extending from the flow-out valves 2251 to 2256 to the reactor 3111, the flow-out valves 2251 to 2256 are closed, the auxiliary valve 2260 is opened and then the main valve (not shown) is full-opened so that the inside of the system is once evacuated to a high vacuum; this may be optionally operated.

Needless to say, the gas species and valve operations described above are changed according to the conditions under which each layer is formed.

The film-forming cylindrical substrate 3115 may be heated by any means so long as it is a heating element of a vacuum type, specifically including electrical resistance heaters such as a sheathed-heater winding heater, a plate heater and a ceramic heater, heat radiation lamp heating elements such as a halogen lamp and an infrared lamp, and heating elements comprising a heat exchange means employing a liquid or gas as a hot medium. As surface materials of the heating means, metals such as stainless steel, nickel, aluminum and copper, ceramics, or heat-resistant polymer resins may be used. As another method that may be used, a chamber exclusively used for heating may be provided in addition to the reactor 3111 and the film-forming cylindrical substrate 3115 having been heated therein may be transported into the reactor 3111 in vacuo.

In the μW-PCVD, the pressure inside the discharge space may appropriately be set at from $1 \times 10^{-1}$ Pa to 13.3 Pa, preferably from $4 \times 10^{-1}$ Pa to 6.7 Pa, and most preferably from 2.7 Pa$\times 10^{-1}$ to 4 Pa.

The pressure outside the discharge space may be at any pressure so long as it is lower than the pressure inside the discharge space. When the pressure inside the discharge space is 13.3 Pa or below, or particularly remarkably 6.7 Pa or below, especially the deposited film characteristics can greatly effectively be improved when the pressure inside the discharge space is 3 times or more the pressure outside the discharge space.

The microwaves may be introduced up to the reactor by a method making use of a waveguide, and may be introduced into the reactor by a method of introducing them through one or a plurality of dielectric window(s). Here, as materials for the window through which the microwave are guided into the reactor, usually used are materials less causative of the loss of microwaves, such as alumina ($Al_2O_3$), aluminum nitride (AlN), boron nitride (BN), silicon nitride (SiN), silicon carbide (SiC), silicon oxide ($SiO_2$), beryllium oxide (BeO), Teflon and polystyrene.

An electric field generated across the gas feed pipe 3117 serving also as an electrode and the film-forming cylindrical substrate 3115 may preferably be a DC electric field, and the electric field may more preferably be directed from the gas feed pipe 3117 serving also as an electrode to the film-forming cylindrical substrate 3115. DC voltage applied to the gas feed pipe 3117 serving also as an electrode, in order to generate the electric field may suitably be from 15 V to 300 V, and preferably from 30 V to 200 V, as average magnitude. The DC voltage may have any waveform without any particular limitations, and those having various waveforms are effective in the present invention. Namely, they may be of any waveforms so long as they cause any change in the direction of voltage. For example, constant voltage whose magnitude does not change with respect to time is effective as a matter of course, and also effective are pulse-like voltage, and pulsating voltage rectified by a rectifier and whose magnitude changes depending on time.

It is also effective to apply an AC voltage. The AC may have any frequency without any problem. In view of practical use, 50 Hz or 60 Hz is suitable in the case of low frequency, and 13.56 MHz is suitable in the case of high frequency. The AC may have any waveform of sine waves and rectangular waves, or any other waveforms. In view of practical use, sine waves are suitable. Here, the voltage is meant as effective value in all instances.

The gas feed pipe 3117 serving also as an electrode may have any size and shape so long as it may cause no disorder of discharge. In view of practical use, it may preferably have a cylindrical shape with a diameter of from 0.1 cm to 5 cm. Here, the length of the gas feed pipe 3117 serving also as an electrode may also be set arbitrarily so long as it is long enough for the electric field to be uniformly applied to the film-forming substrate.

The gas feed pipe 3117 serving also as an electrode may be made of any material so long as its surface is conductive. For example, usually used are stainless steel, metals such as Al, Cr, Mo, Au, In, Nb, Te, V, Ti, Pt, Pb and Fe, alloys of any of these, or glass, ceramic or plastic whose surface has been conductive-treated with any of these.

A process for producing an electrophotographic light-receiving member by forming deposited films by high-frequency plasma CVD making use of frequency of VHF bands (hereinafter "VHF-PCVD") will be described below.

Figure 6:
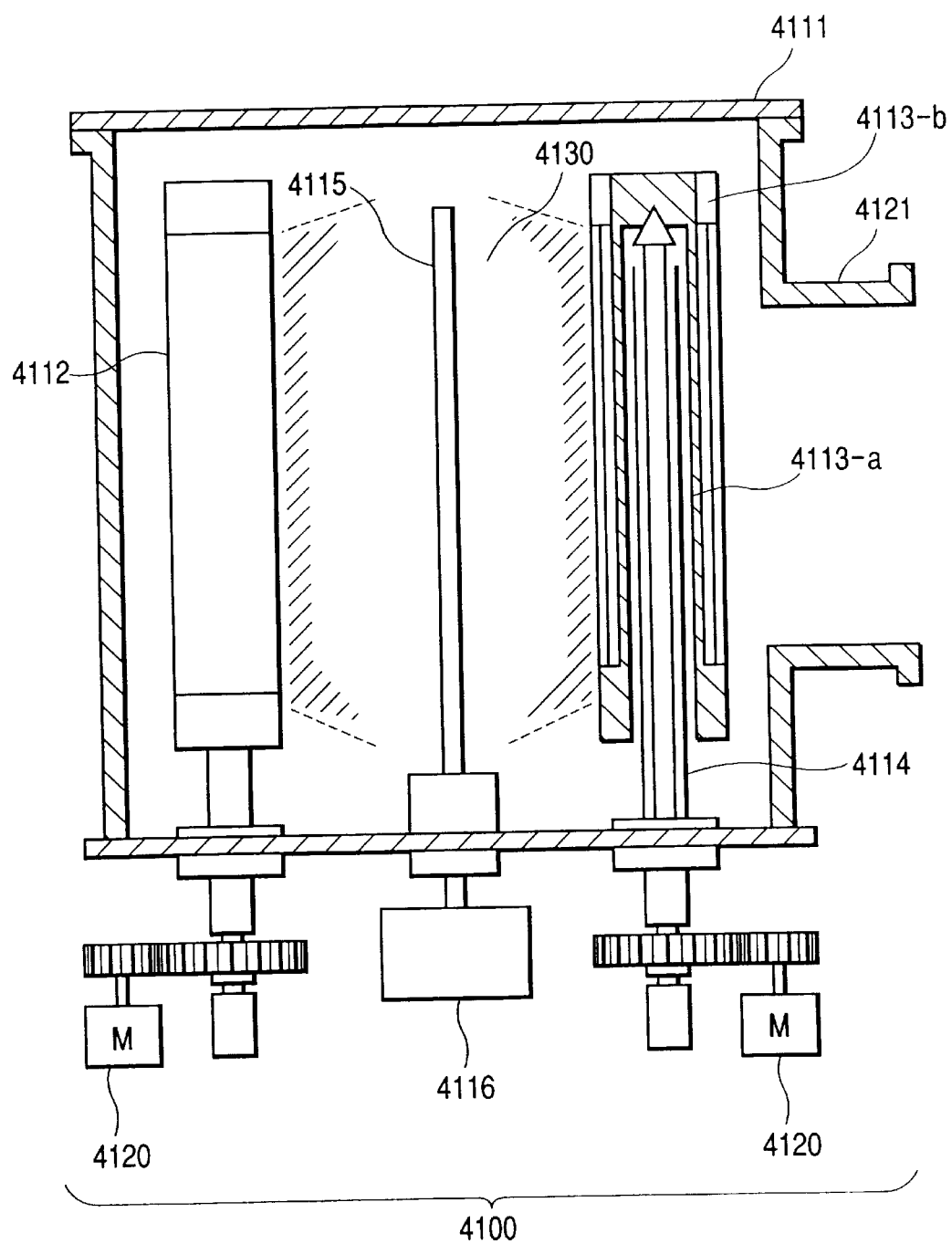
FIG. 6 illustrates an example of an apparatus for producing an electrophotographic light-receiving member by the process of the present invention, which diagrammatically illustrates an apparatus for producing an electrophotographic light-receiving member by very-high-frequency (VHF) glow discharging.

The deposition system 2100 employing RF-PCVD in the production apparatus shown in FIG. 5 is replaced with a deposition system 4100 shown in FIG. 6, which is then connected with the material gas feed system 2200, thus an apparatus for producing an electrophotographic light-receiving member by VHF-PCVD can be obtained.

Stated roughly, this apparatus is constituted of a reactor 4111 having a vacuum-closed structure and capable of being evacuated, the material gas feed system 2200 and an exhaust system (not shown) for evacuating the inside of the reactor. In the reactor 4111, a deposited-film-forming cylindrical substrate 4112 set on an auxiliary substrate 4113-a comprised basically of metal is placed in plurality, and an auxiliary-substrate cap 4113-b is set on each film-forming cylindrical substrate 4112. A heater 4114 for heating the substrates, a material gas feed pipe (not shown) and an electrode 4115 are also provided. Still also, a high-frequency matching box 4116 is connected to the electrode. The inside of the reactor 4111 is connected to a diffusion pump (not shown) through an exhaust pipe 4121.

The material gas feed system 2200 is constituted of gas cylinders 2221 to 2226 for material gases such as $SiH_4$, $GeH_4$, $H_2$, $CH_4$, $B_2H_6$ and $PH_3$, valves 2231 to 2236, 2241 to 2246 and 2251 to 2256, and mass flow controllers 2211 to 2216. The gas cylinders for the respective material gases are connected to the gas feed pipe (not shown) in the reactor 4111 through the valve 2260. A space 4130 surrounded by the film-forming cylindrical substrates 4112 forms a discharge space.

The deposited film can be formed using this VHF-PCVD apparatus in the following way.

First, the film-forming cylindrical substrate 4112 set on the auxiliary substrate 4113-a is set in the reactor 4111. The auxiliary-substrate cap 4113-b is provided on the film-forming cylindrical substrate 4112. The film-forming cylindrical substrate 4112 is rotated by a drive means 4120, and the inside of the reactor 4111 is evacuated through an exhaust pipe 4121 to adjust the internal pressure of the reactor 4111 to $1.3 \times 10^{-5}$ Pa or below. Subsequently, the film-forming cylindrical substrate 4112 is heated to and kept at a prescribed temperature of from 200° C. to 350° C. Here, like those described previously, the heat conduction and heat radiation taking place at this stage is so controlled that the maximum temperature difference between the surface temperature of the film-forming cylindrical substrate 4112 and the surface temperature of the auxiliary-substrate cap 4114-b is 15% or less, and more preferably 10% or less, of the former temperature.

Before material gases for forming deposited films are flowed into the reactor 4111, gas cylinder valves 2231 to 2236 and a leak valve (not shown) of the reactor are checked to make sure that they are closed, and also flow-in valves 2241 to 2246, flow-out valves 2251 to 2256 and an auxiliary valve 2260 are checked to make sure that they are opened. Then, a main valve (not shown) is first opened to evacuate the insides of the reactor 4111 and a gas feed pipe (not shown).

Next, at the time a vacuum gauge (not shown) has been read to indicate a pressure of about $6.7 \times 10^{-4}$ Pa, the auxiliary valve 2260 and the flow-out valves 2251 to 2256 are closed. Thereafter, gas cylinder valves 2231 to 2236 are opened so that gases are respectively introduced from gas cylinders 2221 to 2226, and each gas is controlled to have a pressure of 0.2 Mpa by operating pressure controllers 2261 to 2266. Next, the flow-in valves 2241 to 2246 are slowly opened so that gases are respectively introduced into mass flow controllers 2211 to 2216.

After the film formation is thus ready to start, the respective layers are formed on the film-forming cylindrical substrate 4112 in the following way.

At the time the film-forming cylindrical substrate 4112 has had a prescribed temperature, some necessary flow-out valves among the flow-out valves 2251 to 2256 and the auxiliary valve 2260 are slowly opened so that prescribed material gases are fed into the discharge space 4130 in the reactor 4111 from the gas cylinders 2221 to 2226 through a gas feed pipe (not shown). Next, the mass flow controllers 2211 to 2216 are operated so that each material gas is adjusted to flow at a prescribed rate. In that course, the divergence of the main valve (not shown) is so adjusted that the pressure inside the discharge space 4130 comes to be a prescribed pressure of 133 Pa or below while watching the vacuum gauge (not shown).

At the time the inner pressure has become stable, a VHF power source (not shown) with a frequency of, e.g., 105 MHz is set at the desired electric power, and a VHF power is supplied to the discharge space 4130 through the matching box 4116 to cause glow discharge to take place. Thus, in the discharge space 4130 surrounded by the film-forming cylindrical substrates 4112, the material gases fed into it are excited by discharge energy to undergo dissociation, so that the desired film is formed on each film-forming cylindrical substrate 4112. In this course, each film-forming cylindrical substrate is rotated at the desired rotational speed by means of a substrate rotating motor 4120 so that the layer can be formed uniformly.

After films with desired film thickness have been formed, the supply of VHF power is stopped, and the flow-out valves are closed to stop material gases from flowing into the reactor. Thus, the formation of the deposited films is completed.

The same operation is repeated plural times, whereby light-receiving layers with the desired multi-layer structure can be formed.

Needless to say, when the corresponding layers are formed, the flow-out valves other than those for necessary gases are all closed. Also, in order to prevent the corresponding gases from remaining in the reactor 4111 and in the pipe extending from the flow-out valves 2251 to 2256 to the reactor 4111, the flow-out valves 2251 to 2256 are closed, the auxiliary valve 2260 is opened and then the main valve (not shown) is full-opened so that the inside of the system is once evacuated to a high vacuum; this may be optionally operated.

Needless to say, the gas species and valve operations described above are changed according to the conditions under which each layer is formed.

In any processes, the film-forming substrate temperature at the time of the formation of deposited films may especially be from 200° C. to 350° C., preferably from 230° C. to 330° C., and more preferably from 250° C. to 300° C.

The film-forming cylindrical substrate 4112 may be heated by any means so long as it is a heating element of a vacuum type, specifically including electrical resistance heaters such as a sheathed-heater winding heater, a plate heater and a ceramic heater, heat radiation lamp heating elements such as a halogen lamp and an infrared lamp, and heating elements comprising a heat exchange means employing a liquid or gas as a hot medium. As surface materials of the heating means, metals such as stainless steel, nickel, aluminum and copper, ceramics, or heat-resistant polymer resins may be used. As another method that may be used, a chamber exclusively used for heating may be provided in addition to the reactor 4111 and the film-forming cylindrical substrate 4112 having been heated therein may be transported into the reactor in a vaccum.

The pressure in the discharge space especially in the VHF-PCVD may preferably be set at from $1\times10^{-1}$ Pa to 67 Pa, more preferably from $4\times10^{-1}$ Pa to 40 Pa, and most preferably from $6.7\times10^{-1}$ Pa to 13.3 Pa.

In the VHF-PCVD, the electrode provided in the discharge space may have any size and shape so long as it may cause no disorder of discharge. In view of practical use, it may preferably have a cylindrical shape with a diameter of from 1 mm to 10 cm. Here, the length of the electrode may also be set arbitrarily so long as it is long enough for the electric field to be uniformly applied to the film-forming substrate.

The electrode may be made of any material so long as its surface is conductive. For example, usually used are stainless steel, metals such as Al, Cr, Mo, Au, In, Nb, Te, V, Ti, Pt, Pb and Fe, alloys of any of these, or glass or ceramic whose surface has been conductive-treated with any of these.

In the present invention, preferable numerical values for the film-forming substrate temperature and gas pressure necessary to form the deposited film may be in the ranges as defined above. In usual instances, these conditions can not be independently separately determined. Optimum values should be determined on the basis of mutual and systematic relationship so that the electrophotographic light-receiving member having the desired properties can be formed.

EXPERIMENTS AND EXAMPLES

Experiments and Examples of the present invention are given below. The present invention is by no means limited to these.

Experiment 1

Using the electrophotographic light-receiving member production apparatus shown in FIG. 5, a film-forming cylindrical substrate of 80 mm in diameter, 358 mm in length and 5 mm in wall thickness, made of aluminum was heated under production conditions shown in Table 1. Here, as an auxiliary substrate and an auxiliary-substrate cap, those having conditions shown in Table 2 were used. In order to measure the surface temperatures of the film-forming substrate and auxiliary-substrate cap, a thermocouple was attached in their lengthwise direction, and their surface temperatures were measured to obtain the results shown in FIG. 7.

Figure 7:
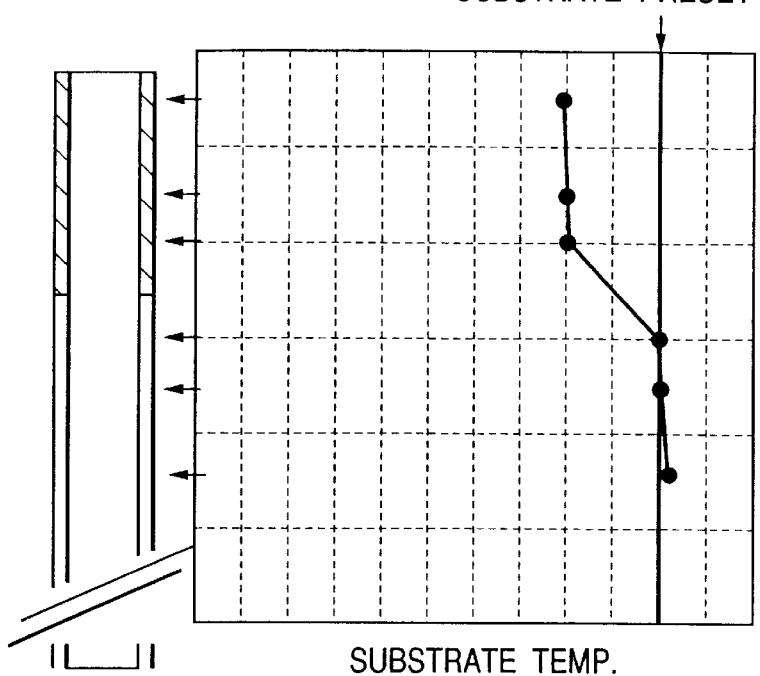
FIG. 7 shows relative values of temperature unevenness in Example 1 of the present invention when the film-forming substrate preset temperature is regarded as 100.

In FIG. 7, temperature unevenness is shown as relative values assuming the substrate (film-forming substrate) pre-set temperature as 100.

From the results shown in FIG. 7, it was found that the temperature of the auxiliary-substrate cap at its part within 20 mm from its lower end was lower than the temperature of the film-forming substrate at its part within 20 mm from its upper end, and their maximum temperature difference was 18%.

Example 1

In Example 1, the electrophotographic light-receiving member production apparatus shown in FIG. 5 was used, and a film-forming cylindrical substrate of 80 mm in diameter, 358 mm in length and 5 mm in wall thickness, made of aluminum was heated under production conditions shown in Table 1. Here, as an auxiliary substrate and an auxiliary-substrate cap, those having conditions shown in Table 3 were used. In order to provide temperature differences as shown in Table 4, they were each prepared in plurality and heated with heaters modified for such heating. A thermocouple was attached to the film-forming substrate at its position of 20 mm from its upper end and the auxiliary-substrate cap at its position of 20 mm from its lower end, and their surface temperatures were measured.

In Table 4, maximum temperature differences between temperature of the film-forming substrate at its position of 20 mm from its upper end and temperature of the auxiliary-substrate cap are shown as relative values assuming the temperature at the position of 20 mm from the upper end of the film-forming substrate as 100.

On the film-forming cylindrical substrates heated under the above conditions, deposited films were formed by RF glow discharging (RF-PCVD) under production conditions shown in Table 5, using the electrophotographic light-receiving member production apparatus shown in FIG. 5 and according to the procedure previously described in detail, thus electrophotographic light-receiving members were produced.

With regard to the electrophotographic light-receiving members thus produced, evaluation was made on the following and in comparison with Comparative Example 1.

Results obtained are shown in Table 1.

Defects:

The surface of the electrophotographic light-receiving member was observed with an optical microscope at magnifications of 50 times in the range of 9 cm². Evaluation was made according to four ranks, i.e., an instance where less than 10 defects of 20 microns or larger were seen was evaluated as AA; less than 20 defects of 20 microns or larger, as A; less than 30 defects of 20 microns or larger, as B; and 30 defects or more of 20 microns or larger, as C.

Black dots:

The electrophotographic light-receiving members produced were each set in an electrophotographic apparatus prepared by modifying a copying machine NP-9330 (manufactured by CANON INC.) so as to be adaptable to high speed, and a halftone chart FY9-9042 (available from CANON INC.) was placed on its original glass plate to take copies, where the images formed were examined on how many black dots with diameter of 0.2 mm or smaller are seen in the same image. AA: Very good, i.e., it was made sure that almost no black dots were seen.
A: Good.
B: No problem in practical use.
C: Problematic in practical use.

As can be seen from the results shown in Table 6, images with less defects can be formed when the maximum temperature difference between temperature of the film-forming substrate at its part within 20 mm from its upper end and temperature of the auxiliary-substrate cap at its part within 20 mm from its lower end is 15% or less, and preferably 10% or less, of the former temperature.

Example 2

In Example 2, the electrophotographic light-receiving member production apparatus shown in FIG. 5 was used, and a film-forming cylindrical substrate of 80 mm in diameter, 358 mm in length and 5 mm in wall thickness, made of aluminum was heated under production conditions shown in Table 1. Here, as an auxiliary substrate and an auxiliary-substrate cap, those having conditions shown in Table 7 were used. These were each prepared in plurality, and the outer surface roughness of the auxiliary-substrate caps was changed as shown in Table 8, where the surface temperatures of the film-forming substrate and auxiliary-substrate cap were measured. A thermocouple was attached to the film-forming substrate at its position of 20 mm from its upper end and the auxiliary-substrate cap at its position of 20 mm from its lower end, and their surface temperatures were measured.

Figure 8:
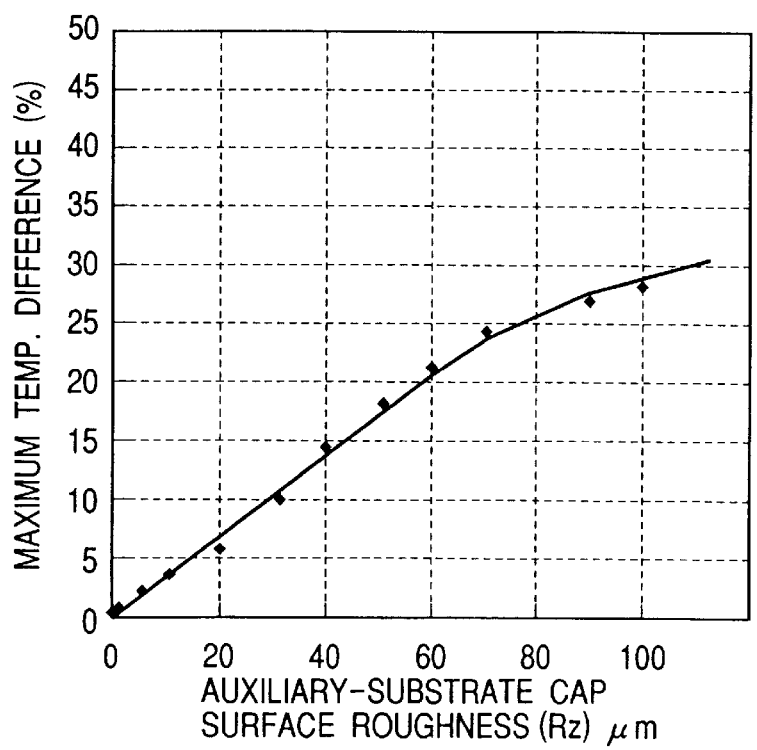
FIG. 8 shows relative values of maximum temperature differences between temperature of the film-forming substrate at its position of 20 mm from its upper end and temperature of the auxiliary-substrate cap, assuming the temperature of the film-forming substrate at its position of 20 mm from its upper end as 100.

Results obtained are shown in FIG. 8.

In FIG. 8, maximum temperature differences between temperature of the film-forming substrate at its position of 20 mm from its upper end and temperature of the auxiliary-substrate cap are shown as relative values assuming the temperature at the position of 20 mm from the upper end of the film-forming substrate as 100.

As can be seen from the results shown in FIG. 8, the maximum temperature difference between temperature of the film-forming substrate at its part within 20 mm from its upper end and temperature of the auxiliary-substrate cap at its part within 20 mm from its lower end becomes greater with an increase in the surface roughness of the auxiliary-substrate cap.

On the film-forming cylindrical substrates heated under the above conditions, deposited films were formed by RF glow discharging (RF-PCVD) under production conditions shown in Table 5, using the electrophotographic light-receiving member production apparatus shown in FIG. 5 and according to the procedure previously described in detail, thus electrophotographic light-receiving members were produced.

With regard to the electrophotographic light-receiving members thus produced, evaluation was made in the same manner as in Example 1 and in comparison with Comparative Example 2.

Results obtained are shown in Table 9.

As can be seen from the results shown in Table 9, the temperature difference between temperature of the film-forming substrate at its part within 20 mm from its upper end and temperature of the auxiliary-substrate cap at its part within 20 mm from its lower end can be controlled when the auxiliary-substrate cap has a surface roughness Rz of 40 $\mu$m or less, and preferably 30 $\mu$m or less, so that good images with less defects can be formed.

Example 3

In Example 3, the electrophotographic light-receiving member production apparatus shown in FIG. 5 was used, and deposited films were formed on a film-forming cylindrical conductive substrate of 80 mm in diameter, 358 mm in length and 3 mm in wall thickness, made of aluminum, by RF glow discharging (RF-PCVD) under production conditions shown in Table 10 according to the procedure previously described in detail, thus electrophotographic light-receiving members were produced. Here, as the auxiliary substrate and auxiliary-substrate cap, those having the size, shape and so forth shown in Table 11 were used. Evaluation was made on defects and black dots in the same manner as in Example 1.

Results obtained are shown in Table 12.

As can be seen from the results shown in Table 12, good results were likewise obtained also when the inner surface of the auxiliary substrate (substrate holder) was constituted of a ceramic material.

Example 4

In Example 4, the electrophotographic light-receiving member production apparatus shown in FIGS. 4A and 4B was used, and deposited films were formed on film-forming cylindrical conductive substrates of 108 mm in diameter, 358 mm in length and 5 mm in wall thickness, made of aluminum, by microwave glow discharging ($\mu$W-PCVD) under production conditions shown in Table 13 and according to the procedure previously described in detail, thus electrophotographic light-receiving members were produced. Here, as the auxiliary substrate and auxiliary-substrate cap, the same as those used in Example 3 were used.

With regard to the electrophotographic light-receiving members thus produced, valuation was made on defects and black dots in the same manner as in Example 1 to obtain very good results like those in Example 3.

Example 5

In Example 5, the electrophotographic light-receiving member production apparatus shown in FIG. 6 was used, and deposited films were formed on film-forming cylindrical conductive substrates of 80 mm in diameter, 358 mm in length and 5 mm in wall thickness, made of aluminum, by VHF-PCVD under production conditions shown in Table 14 according to the procedure previously described in detail, thus electrophotographic light-receiving members were produced. Here, as the auxiliary substrate and auxiliary-substrate cap, the same as those used in Example 4 were used.

With regard to the electrophotographic light-receiving members thus produced, evaluation was made on defects and black dots in the same manner as in Example 1 to obtain very good results like those in Example 4.

As described above, according to the present invention, the maximum temperature difference between temperature at the upper end of the film-forming substrate and temperature at the lower end of the auxiliary-substrate cap provided on the film-forming substrate at its upper part is so controlled as to be not greater than a prescribed value, whereby the film deposited on the auxiliary-substrate cap is improved in adhesion to make it possible to prevent any deposits of films on the part other than the film-forming substrate from coming off and scattering on the film-forming substrate, so that deposited film forming process and apparatus can be materialized that can steadily form deposited film having uniform film thickness and film quality and also can make faulty images greatly less occur. As a result, various problems caused especially in conventional light-receiving members constituted of a-Si can be solved, and photosensitive members exhibiting very superior electrical properties, optical properties, photoconductive properties, image characteristics, durability and service environment properties can be produced.

The present invention also makes it possible to improve various properties of films formed, deposited film forming rate, reproducibility, and productivity of films so that the yield can dramatically be improved when mass production is made.

TABLE 1

| Step or Layers | Gas used & flowrate (sccm) | RF power (W) | Internal Pressure (Pa) | Substrate preset temperature (° C.) | Film thickness ($\mu$m) |
|---|---|---|---|---|---|
| Heating | Ar 1,700 | — | 93 | 280 | — |

TABLE 2

| | Auxiliary substrate/ auxiliary-substrate cap material | Shape & dimensions | Auxiliary substrate/ auxiliary-substrate cap |
|---|---|---|---|
| Experiment 1 | JIS5052 aluminum alloy | Constituted basically as shown in FIG. 1<br>Inner diameter: 64 mm<br>Length: 568 mm<br>Thickness at the middle: 2 mm<br>Auxiliary substrate length: upper, 50 mm; lower, 160 mm<br>Auxiliary substrate thickness: upper, 5 mm; lower, 5 mm | (Inner surface)<br>JIS5052 aluminum alloy<br><br>(Outer surface)<br>Surface roughness: 50 $\mu$m |

TABLE 3

| | Auxiliary substrate/ auxiliary-substrate cap material | Shape & dimensions | Auxiliary substrate/ auxiliary-substrate cap |
|---|---|---|---|
| Example 1 | J1S5052 aluminum alloy | Constituted basically as shown in FIG. 1<br>Inner diameter: 64 mm<br>Length: 568 mm<br>Thickness at the middle: 2 mm<br>Auxliary substrate length: upper, 50 mm; lower, 160 mm<br>Auxiliary substrate thickness: upper, 5 mm: lower, 5 mm | (Inner surface)<br>JIS5052 aluminum alloy<br><br>(Outer surface)<br>Surface roughness: 30 $\mu$m |

TABLE 4

| | | | | | | | | | | | | | (Temperature difference, unit: %) |
|---|---|---|---|---|---|---|---|---|---|---|---|---|---|
| Heater conditions | a | b | c | d | e | f | g | h | i | j | k | l | m |
| Temperature difference | 0.4 | 0.7 | 1.2 | 2.1 | 3.6 | 5.7 | 10 | 15 | 18.2 | 21.0 | 24 | 27.1 | 30.2 |

TABLE 5

| Step or layers | Gas used & flow rate (sccm) | | RF power (W) | Internal pressure (Pa) | Substrate preset temperature (° C.) | Film thickness ($\mu$m) |
|---|---|---|---|---|---|---|
| Blocking layer | $SiH_4$<br>$H_2$<br>$B_2H_6$ | 150<br>390<br>1,500 ppm<br>(based on $SiH_4$) | 160 | 36.6 | 250 | 3 |

TABLE 5-continued

| Step or layers | Gas used & flow rate (sccm) | | RF power (W) | Internal pressure (Pa) | Substrate preset temperature (° C.) | Film thickness (μm) |
|---|---|---|---|---|---|---|
| Light-receiving layer | NO<br>SiH$_4$<br>H$_2$<br>B$_2$H$_6$ | 6.5<br>250<br>2,150<br>1.25 ppm<br>(based on SiH$_4$) | 700 | 73.2 | 270 | 30 |
| Surface layer | SiH$_4$<br>CH$_4$ | 7<br>360 | 250 | 59.9 | 250 | 0.5 |

TABLE 6

| | Example 1 | | | | | | | | Comparative Example 1 | | | | |
|---|---|---|---|---|---|---|---|---|---|---|---|---|---|
| Heater conditions | a | b | c | d | e | f | g | h | i | j | k | l | m |
| Temperature difference (%) | 0.4 | 0.7 | 1.2 | 2.1 | 3.6 | 5.7 | 10 | 15 | 18.2 | 21.0 | 24 | 27.1 | 30.2 |
| Defects | AA | AA | AA | AA | AA | AA | AA | A | A | B | B | B | B |
| Black dots | AA | AA | AA | AA | AA | AA | AA | A | B | B | B | B | B |

TABLE 7

| | Auxiliary substrate/ auxiliary-substrate cap material | Shape & dimensions | Auxiliary substrate/ auxiliary-substrate cap |
|---|---|---|---|
| Example 2 | JIS5052 aluminum alloy | Constituted basically as shown in FIG.1<br>Inner diameter: 64 mm<br>Length: 568 mm<br>Thickness at the middle: 2 mm<br>Auxiliary substrate length: upper, 50 mm; lower, 160 mm<br>Auxiliary substrate thickness: upper, 5 mm; lower, 5 mm | (Inner surface)<br>JIS5052 aluminum alloy<br><br>(Outer surface)<br>Surface roughness<br>Auxiliary substrate: 40 μm<br>of cap: changed as shown in Table 8 |

TABLE 8

| | | | | | | | | | (Surface roughness, unit: μm) | | | | |
|---|---|---|---|---|---|---|---|---|---|---|---|---|---|
| Conditions | a | b | c | d | e | f | g | h | i | j | k | l | m |
| Surface roughness (Rz) | 0.1 | 0.5 | 1 | 5 | 10 | 20 | 30 | 40 | 50 | 60 | 70 | 90 | 100 |

TABLE 9

| | Example 2 | | | | | | | | Comparative Example 2 | | | | |
|---|---|---|---|---|---|---|---|---|---|---|---|---|---|
| Surface roughness conditions | a | b | c | d | e | f | g | h | i | j | k | l | m |
| Defects | AA | AA | AA | AA | AA | AA | AA | A | A | B | B | B | B |
| Black dots | AA | AA | AA | AA | AA | AA | AA | A | B | B | B | B | B |

TABLE 10

| Step or layers | Gas used & flow rate (sccm) | | RF power (W) | Internal pressure (Pa) | Substrate preset temperature (° C.) | Film thickness (μm) |
|---|---|---|---|---|---|---|
| Heating | Ar | 1,700 | — | 93 | 300 | — |
| Blocking layer | SiH$_4$<br>H$_2$<br>B$_2$H$_6$ | 150<br>390<br>1,500 ppm<br>(based on SiH$_4$) | 160 | 36.6 | 250 | 3 |

TABLE 10-continued

| Step or layers | Gas used & flow rate (sccm) | | RF power (W) | Internal pressure (Pa) | Substrate preset temperature (° C.) | Film thickness (μm) |
|---|---|---|---|---|---|---|
| Light-receiving layer | NO<br>SiH$_4$<br>H$_2$<br>B$_2$H$_6$ | 6.5<br>250<br>2,150<br>1.25 ppm<br>(based on SiH$_4$) | 700 | 73.2 | 270 | 30 |
| Surface layer | SiH$_4$<br>CH$_4$ | 45→42→8→6<br>190→212→370→380 | 250 | 59.9 | 250 | 0.7 |

TABLE 11

| Example 4 | Substrate holder material | Shape & dimensions | Auxiliary substrate/ auxiliary-substrate cap |
|---|---|---|---|
| Condition a | J1S5052 aluminum alloy | Constituted basically as shown in FIG. 1<br>Inner diameter: 64 mm<br>Length: 560 mm<br>Thickness at the middle: 2 mm upper, 50 mm; lower, 160 mm<br>Auxiliary substrate thickness: upper, 5 mm; lower, 5 mm | (Outer surface)<br>Surface roughness of auxiliary substrate: 40 μm<br>of cap: 20 μm<br>(Auxiliary substrate inner surface)<br>J1S5052 aluminum alloy |
| Condition b | J1S5052 aluminum alloy | Constituted basically as shown in FIG. 1<br>Inner diameter: 64 mm<br>Length: 560 mm<br>Thickness at the middle: 2 mm upper, 50 mm; lower, 160 mm<br>Auxiliary substrate thickness: upper, 5 mm; lower, 5 mm | (Outer surface)<br>The same as Conditions a<br>(Auxiliary substrate inner surface)<br>Al$_2$O$_3$:Cr$_2$O$_3$ = 1:1<br>Plasma flame spraying<br>Thickness: 50 μm |

TABLE 12

| | | Defects | Black spots |
|---|---|---|---|
| Example 3 | Conditions a | AA | AA |
| | Conditions b | AA | AA |

TABLE 13

| Layers | Gas used & flow rate (sccm) | | Microwave power (W) | Bias Voltage (V) | Internal pressure (Pa) | Substrate preset temperature (° C.) | Film thickness (μm) |
|---|---|---|---|---|---|---|---|
| Light-receiving layer | SiH$_4$<br>H$_2$<br>B$_2$H$_6$<br><br>CH$_4$<br><br>SiF$_4$ | 500<br>2,000<br>30→2 ppm<br>(based on SiH$_4$)<br>150→0<br>(changed linearly)<br>50→80 ppm<br>(based on SiH4) | 900 | 60 | 1.3 | 250 | 28 |
| Surface layer | SiH$_4$<br>SiF$_4$<br>CH$_4$ | 85<br>35<br>450 | 1,000 | 80 | 1.3 | 250 | 0.5 |

TABLE 14

| Layers | Gas used & flow rate (sccm) | | VHF power (W) | Internal pressure (Pa) | Substrate preset temperature (° C.) | Film thickness (μm) |
|---|---|---|---|---|---|---|
| Blocking layer | SiH$_4$ | 150 | 200 | 4 | 290 | 2.5 |
| | H$_2$ | 500 | | | | |
| | B$_2$H$_6$ | 1,500 ppm | | | | |
| | (based on SiH$_4$) | | | | | |
| | NO | 10 | | | | |
| | CH$_4$ | 3 | | | | |
| Light-receiving layer | SiH$_4$ | 200 | 800 | 1.3 | 290 | 28 |
| | H$_2$ | 200 | | | | |
| | B$_2$H$_6$ | 3 ppm | | | | |
| | (based on SiH$_4$) | | | | | |
| Surface layer | SiH$_4$ | 200→10→10 | 100 | 2.7 | 300 | 0.5 |
| | SiF$_4$ | 10→10 | | | | |
| | CH$_4$ | 0→500→500 | | | | |

What is claimed is:

1. A deposited film forming process comprising forming a deposited film on a film-forming substrate by reduced-pressure vapor phase growth;
   wherein the film-forming substrate is set on an auxiliary substrate and is set on an auxiliary-substrate cap member at the upper part thereof; and
   wherein a maximum temperature difference between a temperature at the upper end of the film-forming substrate and a temperature at the lower end of the auxiliary-substrate cap provided on the film-forming substrate at its upper part is so controlled as to be not greater than a prescribed value so that a film deposited on the auxiliary-substrate cap is improved in adhesion and the deposited film is a light-receiving member comprising an amorphous material mainly composed of silicon atoms.

2. The deposited film forming process according to claim 1, wherein the auxiliary-substrate cap has an outer surface having a surface roughness Rz of 40 μm or less.

3. The deposited film forming process according to claim 1, wherein the auxiliary substrate and the auxiliary-substrate cap are each comprised basically of a metal of the same type as that of the film-forming substrate.

4. The deposited film forming process according to claim 1, wherein the auxiliary substrate and the auxiliary-substrate cap are each comprised basically of a metal comprising aluminum.

5. The deposited film forming process according to claim 1, wherein the auxiliary substrate has an inner surface constituted of a ceramic material.

6. The deposited film forming process according to claim 5, wherein the ceramic material constituting the inner surface of the auxiliary substrate is constituted of at least one of a material having a good acid resistance and a material readily capable of receiving radiation heat.

7. The deposited film forming process according to claim 5, wherein the ceramic material constituting the inner surface of the auxiliary substrate is a mixture of Al$_2$O$_3$ and Cr$_2$O$_3$.

8. The deposited film forming process according to claim 1, wherein the auxiliary-substrate cap has an outer surface having a surface roughness Rz of 30 μm or less.

9. A deposited film forming process comprising forming a deposited film on a film-forming substrate by reduced-pressure vapor phase growth;
   wherein the film-forming substrate is set on an auxiliary substrate and is set on an auxiliary-substrate cap member at the upper part thereof;
   wherein a maximum temperature difference between a temperature at the upper end of the film-forming substrate and a temperature at the lower end of the auxiliary-substrate cap provided on the film-forming substrate at its upper part is so controlled as to be not greater than a prescribed value so that a film deposited on the auxiliary-substrate cap is improved in adhesion;
   wherein the deposited film is a light-receiving member comprising an amorphous material mainly composed of silicon atoms; and
   wherein the maximum temperature difference is a maximum temperature difference between temperature at the upper end of the film-forming substrate at its part within 20 mm from the upper end and temperature at the lower end of the auxiliary-substrate cap at its part within 20 mm from the lower end.

10. A deposited film forming process comprising forming a deposited film on a film-forming substrate by reduced-pressure vapor phase growth;
    wherein the film-forming substrate is set on an auxiliary substrate and is set on an auxiliary-substrate cap member at the upper part thereof;
    wherein a maximum temperature difference between a temperature at the upper end of the film-forming substrate and a temperature at the lower end of the auxiliary-substrate cap provided on the film-forming substrate at its upper part is so controlled as to be 15% or less of the film-forming substrate temperature so that a film deposited on the auxilary-substrate cap is improved in adhesion.

11. The deposited film forming process according to claim 10, wherein the deposited film is a light-receiving member comprising an amorphous material mainly composed of silicon atoms.

12. The deposited film forming process according to claim 11, wherein the maximum temperature difference is 10% or less of the film-forming substrate temperature.

13. The deposited film forming process according to claim 10, wherein the maximum temperature difference is 10% or less of the film-forming substrate temperature.

14. The deposited film forming process according to claim 10, wherein the maximum temperature difference is a maximum temperature difference between temperature at the upper end of the film-forming substrate at its part within 20 mm from the upper end and temperature at the lower end of the auxiliary-substrate cap at its part within 20 mm from the lower end.

15. The deposited film forming process according to claim 10, wherein the auxiliary-substrate cap has an outer surface having a surface roughness Rz of 40 μm or less.

16. The deposited film forming process according to claim 10, wherein the auxiliary-substrate cap has an outer surface having a surface roughness Rz of 30 μm or less.

17. The deposited film forming process according to claim 10, wherein the auxiliary substrate and the auxiliary-substrate cap are each comprised basically of a metal of the same type as that of the film-forming substrate.

18. The deposited film forming process according to claim 10, wherein the auxiliary substrate and the auxiliary-substrate cap are each comprised basically of a metal comprising aluminum.

19. The deposited film forming process according to claim 10, wherein the auxiliary substrate has an inner surface constituted of a ceramic material.

20. The deposited film forming process according to claim 19, wherein the ceramic material constituting the inner surface of the auxiliary substrate is constituted of at least one of a material having a good acid resistance and a material readily capable of receiving radiation heat.

21. The deposited film-forming process according to claim 19, wherein the ceramic material constituting the inner surface of the auxiliary substrate is a mixture of $Al_2O_3$ and $Cr_2O_3$.

22. A deposited film forming process comprising the steps of:
controlling a maximum temperature difference between a temperature at the upper end of a film-forming substrate and a temperature at the lower end of a cap member, the cap member being set on the upper part of the film-forming substrate; and
forming a deposited film comprising an amorphous material mainly composed of silicon atoms on the film-forming substrate by reduced-pressure vapor phase growth;
wherein the maximum temperature difference is a maximum temperature difference between temperature at the upper end of the film-forming substrate at its part within 20 mm from the upper end and temperature at the lower end of the auxiliary-substrate cap at its part within 20 mm from the lower end.

23. A deposited film forming process comprising the steps of:
controlling a maximum temperature difference between temperature at the upper end of a film-forming substrate and temperature at the lower end of a cap member such that the maximum temperature difference is 15% or less of the film-forming substrate, the cap member being set on the upper part of the film-forming substrate; and
forming a deposited film comprising an amorphous material mainly composed of silicon atoms on the film-forming substrate by reduced-pressure vapor phase growth.

24. The deposited film forming process according to claim 23, wherein the film-forming substrate is set on an auxiliary substrate and wherein the cap member set on the upper end of the film-forming substrate is also set on the auxiliary substrate.

25. The deposited film forming process according to claim 24, wherein the auxiliary substrate and the cap member are each comprised basically of a metal of the same type as that of the film-forming substrate.

26. The deposited film forming process according to claim 24, wherein the auxiliary substrate and the cap member are each comprised basically of a metal comprising aluminum.

27. The deposited film forming process according to claim 24, wherein the auxiliary substrate has an inner surface constituted of a ceramic material.

28. The deposited film-forming process according to claim 27, wherein the ceramic material constituting the inner surface of the auxiliary substrate is constituted of at least one of a material having a good acid resistance and a material readily capable of receiving radiation heat.

29. The deposited film forming process according to claim 27, wherein the ceramic material constituting the inner surface of the auxiliary substrate is a mixture of $Al_2O_3$ and $Cr_2O_3$.

30. The deposited film forming process according to claim 23, wherein the deposited film is a light-receiving member comprising an amorphous material mainly composed of silicon atoms.

31. The deposited film forming process according to claim 23, wherein the maximum temperature difference is 10% or less of the film-forming substrate temperature.

32. The deposited film forming process according to claim 23, wherein the maximum temperature difference is a maximum temperature difference between temperature at the upper end of the film-forming substrate at its part within 20 mm from the upper end and temperature at the lower end of the cap member at its part within 20 mm from the lower end.

33. The deposited film forming process according to claim 23, wherein the cap member has an outer surface having a surface roughness Rz of 40 μm or less.

34. The deposited film forming process according to claim 23, wherein the cap member has an outer surface having a surface roughness Rz of 30 μm or less.

* * * * *

UNITED STATES PATENT AND TRADEMARK OFFICE
CERTIFICATE OF CORRECTION

PATENT NO.   : 6,335,281 B1
DATED        : January 1, 2002
INVENTOR(S)  : Yoshio Segi et al.

It is certified that error appears in the above-identified patent and that said Letters Patent is hereby corrected as shown below:

Column 1,
Line 57, "6111" should read -- 6111, --;
Line 59, "6123" should read -- 6123, --;
Line 60, "6121" should read -- 6121, --;
Line 61, "6111" should read -- 6111, --; and
Line 63, "6122" should read -- 6122. --.

Column 2,
Line 67, "part" should read -- parts --.

Column 4,
Line 33, "wherein;" should read -- wherein --.

Column 5,
Line 54, "auxiliary-substrate" should read -- auxiliary-substrate cap --.

Column 6,
Line 51, "Si—H$_2$" should read -- Si-H$_2$ --; and
Line 52, "Si—H" should read -- Si-H --.

Column 7,
Line 53, "are." should read -- are --.

Column 10,
Line 8, "auxiliary-substrate" should read -- auxiliary substrate --.

Column 12,
Line 2, "the" should be deleted.

Column 14,
Line 52, "of." should read -- of, --.

Column 16,
Line 42, "SiF4," should read -- SiF$_4$, --.

Column 18,
Line 49, "microwave" should read -- microwaves --.

UNITED STATES PATENT AND TRADEMARK OFFICE
CERTIFICATE OF CORRECTION

PATENT NO. : 6,335,281 B1
DATED : January 1, 2002
INVENTOR(S) : Yoshio Segi et al.

It is certified that error appears in the above-identified patent and that said Letters Patent is hereby corrected as shown below:

<u>Column 32,</u>
Line 40, "thereof;" should read -- thereof; and --

Signed and Sealed this

Twenty-first Day of May, 2002

Attest:

*Attesting Officer*

JAMES E. ROGAN
*Director of the United States Patent and Trademark Office*